US012735784B2

(12) United States Patent
Kim et al.

(10) Patent No.: US 12,735,784 B2
(45) Date of Patent: Sep. 15, 2026

(54) MASK, MASK ASSEMBLY HAVING THE SAME, AND METHOD OF REPAIRING THE MASK

(71) Applicant: Samsung Display Co., Ltd., Yongin-si (KR)

(72) Inventors: Jeongkuk Kim, Yongin-si (KR); Youngmin Moon, Yongin-si (KR); Seungyong Song, Yongin-si (KR); Eunbee Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 561 days.

(21) Appl. No.: 18/296,093

(22) Filed: Apr. 5, 2023

(65) Prior Publication Data

US 2023/0407461 A1 Dec. 21, 2023

(30) Foreign Application Priority Data

Jun. 16, 2022 (KR) ........................ 10-2022-0073697

(51) Int. Cl.
*C23C 16/04* (2006.01)
*H10K 71/16* (2023.01)
*H10K 59/10* (2023.01)

(52) U.S. Cl.
CPC ............ *C23C 16/042* (2013.01); *H10K 59/10* (2023.02); *H10K 71/166* (2023.02)

(58) Field of Classification Search
CPC .... C23C 16/042; C23C 14/042; H10K 59/10; H10K 71/166; B22F 10/28; B33Y 10/00; B23K 26/0624
See application file for complete search history.

(56) References Cited

U.S. PATENT DOCUMENTS

2005/0056625 A1* 3/2005 Haight ................. B23K 26/361 219/121.73
2014/0177055 A1* 6/2014 Lee .................... B23K 26/0604 359/557
2021/0379694 A1* 12/2021 Jo ........................ B23K 26/032

FOREIGN PATENT DOCUMENTS

CN 113206138 A * 8/2021 ........... C23C 14/042
CN 113960877 A * 1/2022 ............... G03F 1/54
(Continued)

OTHER PUBLICATIONS

Nakayama et al., CN 113960877 A, Machine Translation. (Year: 2025).*

(Continued)

*Primary Examiner* — Binh X Tran
*Assistant Examiner* — Christopher Remavege
(74) *Attorney, Agent, or Firm* — CANTOR COLBURN LLP

(57) ABSTRACT

A method of repairing a mask includes providing a mask including a mother member, a plurality of first openings, and an over-processed opening adjacent to one of the plurality of first openings and having a size different from a size of each of the plurality of first openings, each of the plurality of first openings and the over-processed opening defined on the mother member, forming a supplement portion in at least a portion of the over-processed opening by irradiating a first laser beam to an area surrounding the over-processed opening of the mother member, and forming a plurality of second openings spaced apart from each other on the mother member by irradiating a second laser beam to the supplement portion.

12 Claims, 27 Drawing Sheets

(56) References Cited

FOREIGN PATENT DOCUMENTS

| | | | | |
|---|---|---|---|---|
| JP | 2003332226 A | * 11/2003 | | |
| JP | 2021-053689 | 4/2021 | | |
| KR | 10-2010-0057266 | 5/2010 | | |
| KR | 10-1866382 | 6/2018 | | |
| KR | 20210130553 A | * 11/2021 | ........... | C23C 14/042 |

OTHER PUBLICATIONS

KR-20210130553-A, Machine Translation. (Year: 2025).*
CN-113206138-A, Machine Translation. (Year: 2025).*
JP-2003332226-A, Machine Translation. (Year: 2025).*

* cited by examiner

DP
TFE
HPP
PDL
PDP
DP-CL
SUB
I'
I
NLA
LA3
NLA
LA2
NLA
LA1
NLA
OP-3
OP-2
OP-1
AE3 HCL EM3 ECL CE
OL3
AE2 HCL EM2 ECL CE
OL2
AE1 HCL EM1 ECL CE
OL1

MK'
BL
II'
MM
O-M
OE-O
O-M
O-C
LD
LL1
P-MM
O-M
O-M
DR2
DR3
DR1
S1
S2
II

MK'
BL
V'
MM
0-M
0-Ma
Tp1
PP1
P2
INa
P1
INb
I2
I1
PP2
V
S1
Tp2
S2
DR2
DR3
DR1

MK'
BL
III'
MM
O-M
O-M
O-C
OE-O
O-M
MTP
LD
LL2
P-MM
O-M
S1
S2
III
DR2
DR3
DR1

MK'
BL
II'
MM
O-M
PW
O-C
OE-O
O-M
LD
LL1
PW
O-C
O-M
P-MM
O-M
S1
S2
II
DR3
DR2
DR1

MK'
BL
III'
MM
O-M
O-C
O-M
OE-O
MTP
O-C
LD
LL2
O-M
P-MM
O-M
S1
S2
III
DR3
DR2
DR1

MK'
BL
V'
MM
0-Ma
0-M
PP1
Tp1
INa
P2
P1
INb
I2
I1
PP2
S1
Tp2
S2
V
DR3
DR2
DR1

MK'
BL
VI'
MM
O-M
NEA
OA
LD
LL3
O-M'
OA
O-M
S1
S2
VI
DR3
DR2
DR1

MASK, MASK ASSEMBLY HAVING THE SAME, AND METHOD OF REPAIRING THE MASK

CROSS-REFERENCE TO RELATED APPLICATION(S)

This application claims priority to and benefits of Korean Patent Application No. 10-2022-0073697 under 35 U.S.C. § 119, filed on Jun. 16, 2022, in the Korean Intellectual Property Office (KIPO), the entire contents of which are incorporated herein by reference.

BACKGROUND

1. Technical Field

The disclosure relates to a mask, a mask assembly, and a method of repairing a mask included in a mask assembly.

2. Description of the Related Art

Display devices, such as televisions, mobile phones, tablet computers, navigation devices, and game devices, include a display panel displaying images. The display panel includes pixels each including a driving element such as a transistor and a display element such as an organic light emitting diode. The display element is formed by depositing an electrode, a functional layer, and a light emitting pattern on a substrate using a mask assembly.

The mask assembly includes a mask provided with openings defined therethrough to define deposition areas. However, defects, such as, where the openings are not formed at a designed position, where the openings are not formed with a designed size, etc., occur in a process of forming the openings on the mask. The defective mask is not used in a deposition process and is discarded, and as a result, a production yield of the mask decreases.

SUMMARY

The disclosure provides a method of repairing a mask whose opening is over processed or under processed.

The disclosure provides a mask manufactured by the mask repairing method and a mask assembly including the mask manufactured by the mask repairing method.

Embodiments of the disclosure provide a method of repairing a mask. The repairing method may include providing a mask including a mother member, a plurality of first openings, and an over-processed opening adjacent to one of the plurality of first openings and having a size different from a size of each of the plurality of first openings, each of the plurality of first openings and the over-processed opening defined on the mother member, forming a supplement portion in at least a portion of the over-processed opening by irradiating a first laser beam to an area surrounding the over-processed opening of the mother member, and forming a plurality of second openings spaced apart from each other on the mother member by irradiating a second laser beam to the supplement portion.

An intensity of the second laser beam may be greater than an intensity of the first laser beam.

The first laser beam may be a pulse laser beam with a pulse width of microsecond or nanosecond.

The second laser beam may be a pulse laser beam with a pulse width of picosecond or femtosecond.

The supplement portion may be formed by melting a portion of the mother member, and a thickness of the supplement portion may be less than a thickness of the mother member that is not melted in a thickness direction of the mask.

The forming of the supplement portion may further include providing a metal powder in the over-processed opening before the irradiating of the first laser beam.

The plurality of first openings may be formed on the mother member by a wet-etching process.

The mask after the forming of the plurality of second openings may include a first portion disposed between adjacent ones of the plurality of second openings in a plan view and a second portion disposed between adjacent ones of the plurality of first openings in a plan view, and a thickness of the second portion may be less than a thickness of the first portion in a thickness direction of the mask.

The plurality of second openings may be arranged with adjacent one the plurality of first openings in a direction in a plan view.

The mask may further include an insufficient opening having a size smaller than the size of each of the plurality of first openings, and the method may further include irradiating a third laser beam to an area adjacent to the insufficient opening of the mask.

An intensity of the third laser beam and an intensity of the second laser beam may be same.

The mask may further include a non-processed area adjacent to at least one of the plurality of first openings, and the method may further include irradiating a third laser beam to the non-processed area.

Embodiments of the disclosure provide a mask that may include a mother member including a metal, and a plurality of openings defined on the mother member. A portion of the mother member surrounding one of the plurality of openings may include a first portion and a second portion, and a thickness of the first portion and a thickness of the second portion in a thickness direction of the mother member may be different from each other.

Embodiments of the disclosure provide a mask assembly that may include a frame and a mask disposed on the frame and including a mother member and a plurality of openings defined on the mother member. The mother member may include a first surface facing the frame, a second surface opposite to the first surface, and inner side surfaces connecting the first surface and the second surface and defining each of the plurality of openings. Lengths of two of the inner side surfaces in a thickness direction of the mask may be different from each other.

The first surface may have a step difference in an area between adjacent one of the plurality of openings.

The second surface may be flat in an area between adjacent one of the plurality of openings.

The plurality of openings may include a first opening and a second opening arranged in a direction, the inner side surfaces may include a first inner surface defining the first opening and a second inner surface defining the second opening, a length of the first inner surface in the thickness direction may vary along an outer circumferential surface of the first opening, and a length the second inner surface in the thickness direction may be constant along an outer circumferential surface of the second opening.

The first inner surface may include an inclination surface connecting the first surface and the second surface and inclined at a constant inclination angle with respect to the second surface, and the inclination surface and the second surface may form an angle equal to or less than about 90 degrees.

The second inner surface may include inclination surfaces connected to each other and connecting the first surface and the second surface, and the inclination surfaces may be inclined at different inclination angles from each other with respect to the second surface.

A length of each of the inclination surfaces in the thickness direction may be different from each other.

According to the above, the mask having the over-processed opening may be repaired by melting the mother member of the mask according to the method of repairing the mask.

According to the above, the mask having the insufficient opening whose planar size is smaller than a designed size or the mask having the non-processed area may be repaired using the laser beam.

According to the above, the mask with defects may be repaired to be used without being discarded, and thus, the production yield of the mask may be improved. The mask repaired according to the method of repairing the mask of the disclosure may have the opening at a designed position and with the designed size, the reliability of the mask may be improved.

BRIEF DESCRIPTION OF THE DRAWINGS

The above and other advantages of the disclosure will become readily apparent by reference to the following detailed description in conjunction with the accompanying drawings wherein.

DETAILED DESCRIPTION OF THE EMBODIMENTS

Figure 1:
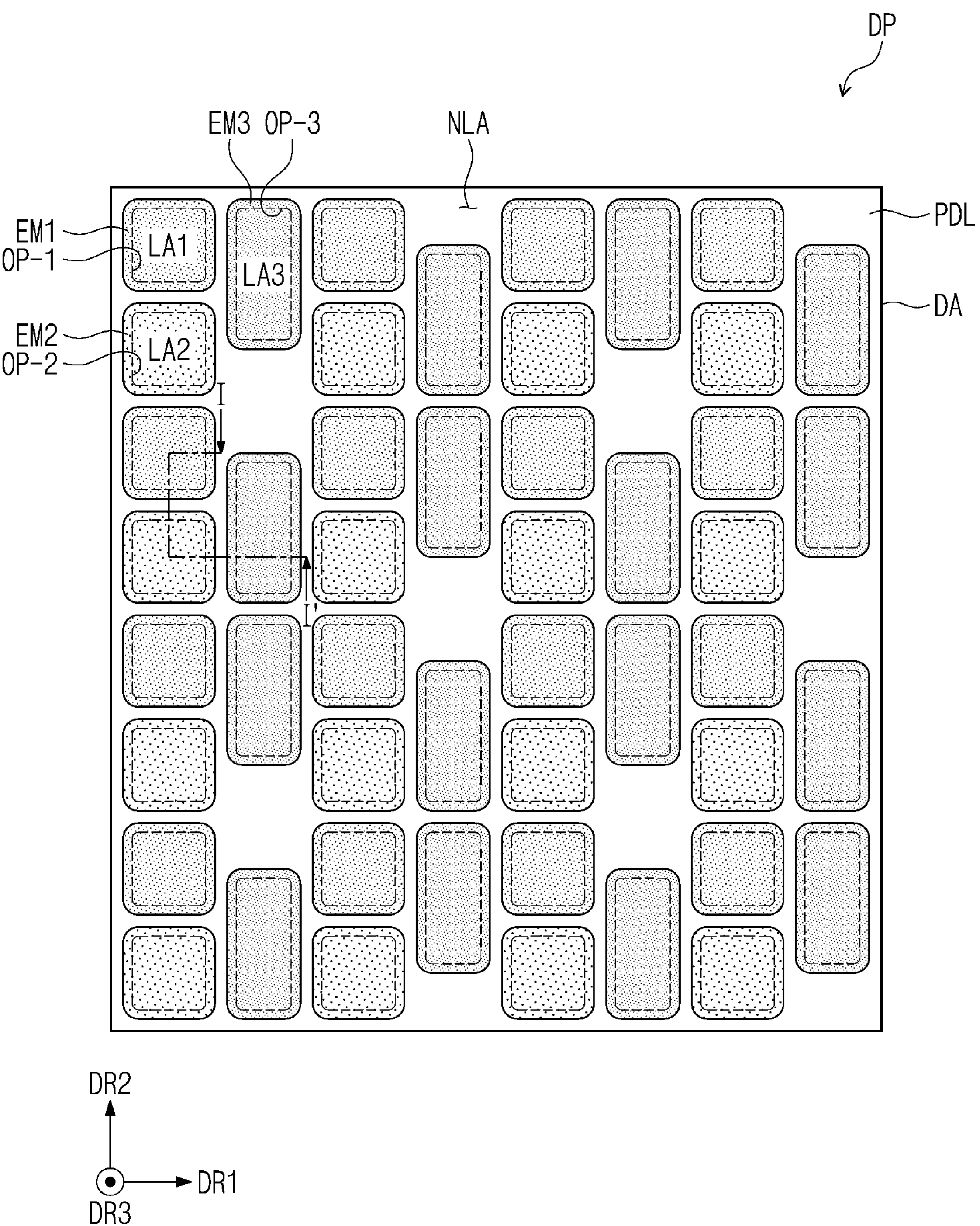
FIG. 1 is an enlarged plan view of a display panel according to an embodiment of the disclosure.

The disclosure may be variously modified and realized in many different forms, and thus specific embodiments will be illustrated in the drawings and described in detail hereinbelow. However, the disclosure is not limited to the specific disclosed forms, and be construed to include all modifications, equivalents, or replacements included in the spirit and scope of the disclosure.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Like numerals refer to like elements throughout. In the drawings, the thickness, ratio, and dimension of components are exaggerated for effective description of the technical content. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements are not limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a mask, a mask assembly including the mask, and a method of repairing the mask of the disclosure will be described with reference to accompanying drawings.

Figure 2:
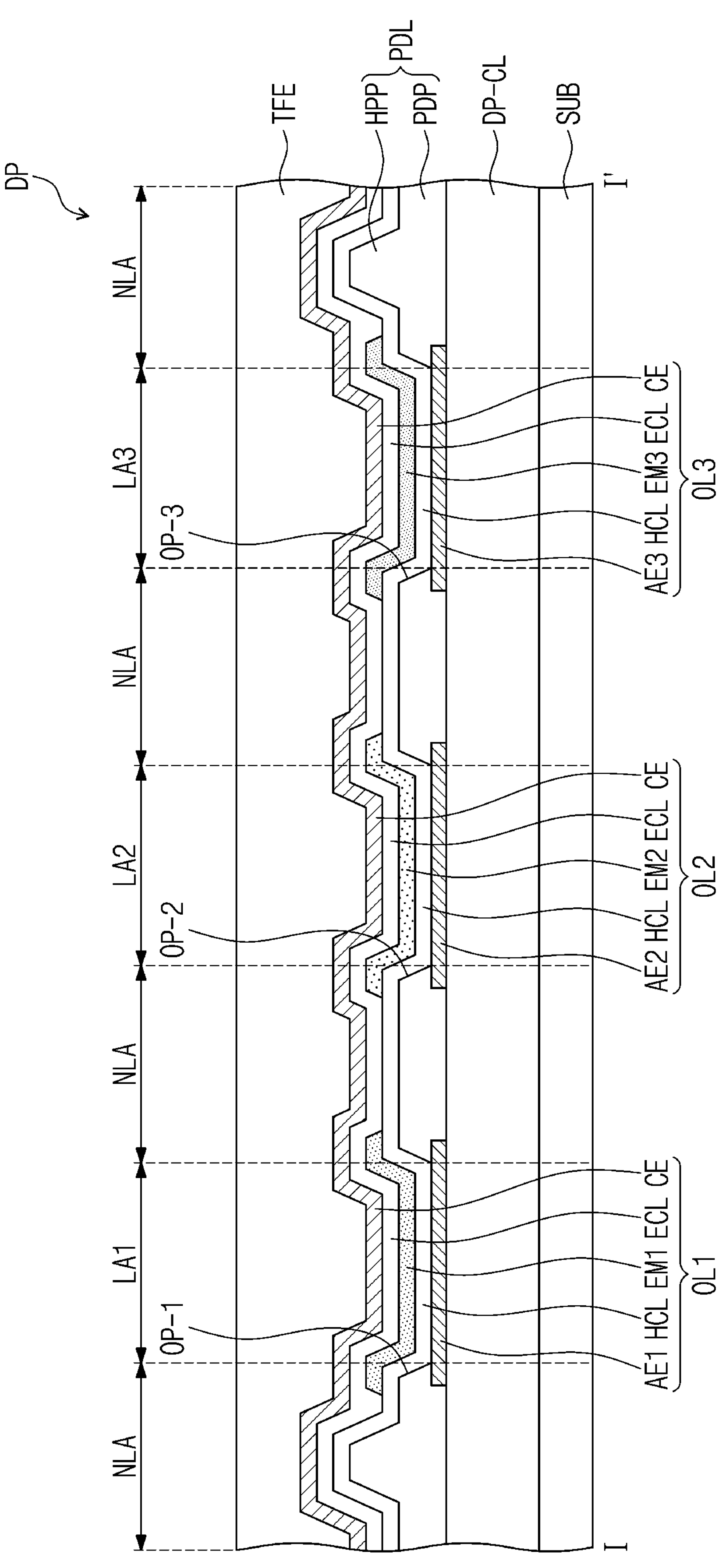
FIG. 2 is a schematic cross-sectional view of a display panel taken along line I-I' of FIG. 1 according to an embodiment of the disclosure.

FIG. 1 is an enlarged plan view of a display panel DP according to an embodiment of the disclosure. FIG. 2 is a schematic cross-sectional view of the display panel DP taken along line I-I' of FIG. 1 according to an embodiment of the disclosure.

A mask MK (refer to FIG. 3) described later may be used to form at least one of functional layers included in the display panel DP. FIGS. 1 and 2 respectively show a plan view and a cross-sectional view of the display panel DP manufactured by a deposition process using the mask MK (refer to FIG. 3) according to an embodiment.

In the embodiment, the display panel DP may be a light emitting type display panel. For example, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as an embodiment of the display panel DP.

Referring to FIG. 1, the display panel DP may include a display area DA in which an image is displayed. In the embodiment, the display area DA may be substantially parallel to a plane defined by a first direction DR1 and a second direction DR2. A thickness direction of the display panel DP may be defined as a third direction DR3 substantially perpendicular to each of the first direction DR1 and the second direction DR2. In the embodiment, front (or upper) and rear (or lower) surfaces of each member or each unit described hereinafter may be distinguished from each other with respect to the third direction DR3.

In the disclosure, the expression "when viewed in a plane (or in a plan view)" may mean a state of being viewed in the third direction DR3. In the disclosure, the expression "on a cross-section" may mean a state of being viewed in the first direction DR1 or the second direction DR2. Directions indicated by the first, second, and third directions DR1, DR2, and DR3 are relative to each other, and thus, the directions indicated by the first, second, and third directions DR1, DR2, and DR3 may be changed to other directions.

The display area DA of the display panel DP may include multiple light emitting areas LA1, LA2, and LA3 and a non-light-emitting area NLA.

The light emitting areas LA1, LA2, and LA3 may respectively correspond to light emitting elements and may respectively correspond to areas from which lights provided by the light emitting elements exit. The light emitting areas LA1, LA2, and LA3 may include a first light emitting area LA1, a second light emitting area LA2, and a third light emitting area LA3.

The first, second, and third light emitting areas LA1, LA2, and LA3 may be distinguished from each other by colors of lights traveling to the outside of the display panel DP. For example, each of the first light emitting area LA1, the second light emitting area LA2, and the third light emitting area LA3 may emit one of a red light, a green light, and a blue light. However, the colors of the lights emitted from the first, second, and third light emitting areas LA1, LA2, and LA3 are not limited thereto or thereby. The non-light-emitting area NLA may define a boundary between the first, second, and third light emitting areas LA1, LA2, and LA3 and may prevent colors of the lights emitted by the first, second, and third light emitting areas LA1, LA2, and LA3 from being mixed.

The first light emitting area LA1 and the second light emitting area LA2, which are arranged in the second direction DR2, and the third light emitting area LA3 spaced apart from the first and second light emitting areas LA1 and LA2 in the first direction DR1 may form one pixel. Each of the first light emitting area LA1, the second light emitting area LA2, and the third light emitting area LA3 may correspond to a sub-pixel forming one pixel.

Each of the first, second, and third light emitting areas LA1, LA2, and LA3 may be provided in plural and may be repeatedly arranged in the display area DA in an arrangement. Referring to FIG. 1, the first light emitting areas LA1 and the second light emitting areas LA2 may be alternately arranged in the second direction DR2. The third light emitting areas LA3 may be arranged in the second direction DR2. The third light emitting areas LA3 may be arranged staggered in the first direction DR1 to allow centers thereof to be shifted from each other. The first light emitting areas LA1 adjacent to each other in the first direction DR1 may be arranged with the third light emitting area LA3 interposed therebetween, and the second light emitting areas LA2 adjacent to each other in the first direction DR1 may be arranged with the third light emitting area LA3 interposed therebetween. However, the arrangement of the first, second, and third light emitting areas LA1, LA2, and LA3 shown in FIG. 1 is merely an example, and the disclosure is not limited thereto or thereby.

The first, second, and third light emitting areas LA1, LA2, and LA3 may have a shape in a plan view. For example, each of the first, second, and third light emitting areas LA1, LA2, and LA3 may have a quadrangular shape as shown in FIG. 1, however, the disclosure is limited thereto or thereby. According to an embodiment, each of the first, second, and third light emitting areas LA1, LA2, and LA3 may have a polygonal shape, a circular shape, an oval shape, or the like.

According to an embodiment, at least two of the first, second, and third light emitting areas LA1, LA2, and LA3 may have different sizes from each other in a plan view. For example, the first light emitting area LA1 and the second light emitting area LA2 may have substantially the same size in a plan view, and the first light emitting area LA1 and the third light emitting area LA3 may have different sizes from each other in a plan view. However, the sizes of the first, second, and third light emitting areas LA1, LA2, and LA3 are not limited to that shown in FIG. 1 and may be determined depending on the colors of the lights or a light emitting efficiency.

Referring to FIGS. 1 and 2, the display panel DP may include a base substrate SUB, a circuit element layer DP-CL, a pixel definition layer PDL, multiple light emitting elements OL1, OL2, and OL3, and an encapsulation layer TFE.

The base substrate SUB may provide a base surface on which the circuit element layer DP-CL is disposed. The base substrate SUB may include a synthetic resin layer. The synthetic resin layer may be formed on a support substrate used to manufacture the display panel DP, and a conductive layer and an insulating layer may be formed on the synthetic resin layer. The support substrate may be removed, and the synthetic resin layer from which the support substrate is removed may correspond to the base substrate SUB.

The circuit element layer DP-CL may be disposed on the base substrate SUB. The circuit element layer DP-CL may include driving elements such as transistors and a capacitor, which are electrically connected to the light emitting elements OL1, OL2, and OL3 and signal lines. The circuit element layer DP-CL may be formed by forming an insulating layer, a semiconductor layer, and a conductive layer through a coating or deposition process and by patterning the insulating layer, the semiconductor layer, and the conductive layer through multiple photolithography processes.

The light emitting elements OL1, OL2, and OL3 and the pixel definition layer PDL may be disposed on the circuit element layer DP-CL. Each of the light emitting elements OL1, OL2, and OL3 may be an organic light emitting element, an inorganic light emitting element, a quantum dot light emitting element, a micro-LED light emitting element, or a nano-LED light emitting element. However, the light emitting elements OL1, OL2, and OL3 are not particularly limited as long as the light is generated in response to electrical signals or an amount of the light is controlled by the electrical signals.

The light emitting elements OL1, OL2, and OL3 may include a first, second, and third light emitting elements OL1, OL2, and OL3. Each of the first, second, and third light emitting elements OL1, OL2, and OL3 may include a corresponding first electrode AE1, AE2, and AE3, a hole control layer HCL, a corresponding light emitting pattern EM1, EM2, and EM3, an electron control layer ECL, and a second electrode CE, which are sequentially stacked.

An area in which the first light emitting element OL1 is disposed may correspond to the first light emitting area LA1, an area in which the second light emitting element OL2 is disposed may correspond to the second light emitting area LA2, and an area in which the third light emitting element OL3 is disposed may correspond to the third light emitting area LA3. The first electrodes AE1, AE2, and AE3 of the first, second, and third light emitting elements OL1, OL2, and OL3 may be disposed spaced apart from each other on the circuit element layer DP-CL.

The pixel definition layer PDL may include a pixel definition layer portion PDP and a protruding portion HPP disposed on the pixel definition layer portion PDP. The pixel definition layer portion PDP of the pixel definition layer PDL may be provided with a first, second, and third light emitting openings OP-1, OP-2, and OP-3 defined therethrough to respectively correspond to the first electrodes AE1, AE2, and AE3. The first, second, and third light emitting openings OP-1, OP-2, and OP-3 may respectively overlap the first electrodes AE1, AE2, and AE3 in a plan view, and each of the first, second, and third light emitting openings OP-1, OP-2, and OP-3 may expose at least a portion of a corresponding first electrode AE1, AE2, and AE3.

The pixel definition layer portion PDP may define an area from which the light is emitted. The first electrode AE1 of the first light emitting element OL1 exposed through the first light emitting opening OP-1 may correspond to the first light emitting area LA1. The first electrode AE2 of the second light emitting element OL2 exposed through the second light emitting opening OP-2 may correspond to the second light emitting area LA2. The first electrode AE3 of the third light emitting opening OP-3 exposed through the third light emitting element OL3 may correspond to the third light emitting area LA3. The area in which the pixel definition layer portion PDP is disposed may correspond to the non-light-emitting area NLA, and the non-light-emitting area NLA may surround the first, second, and third light emitting areas LA1, LA2, and LA3.

The protruding portion HPP may be disposed on a portion of the non-light-emitting area NLA. The protruding portion HPP may not overlap the first, second, and third light emitting areas LA1, LA2, and LA3 in a plan view. The protruding portion HPP may protrude upward from an upper surface of the pixel definition layer portion PDP. Accordingly, the protruding portion HPP may support a mask MK (refer to FIG. 5) in the deposition process and may separate a deposition area and the mask MK (refer to FIG. 5).

The protruding portion HPP and the pixel definition layer portion PDP may include a same material and may be integral with each other, however, the embodiment is not limited thereto or thereby. According to an embodiment, the protruding portion HPP and the pixel definition layer portion PDP may include a same material but may be formed under different deposition conditions or the protruding portion HPP the pixel definition layer portion PDP may include different materials. According to an embodiment, the protruding portion HPP may be omitted.

The light emitting patterns EM1, EM2, and EM3 may be disposed on the first electrodes AE1, AE2, and AE3, respectively. The light emitting patterns EM1, EM2, and EM3 of the first, second, and third light emitting elements OL1, OL2, and OL3 may be disposed to correspond to the first, second, and third light emitting openings OP-1, OP-2, and OP-3, respectively.

The light emitting patterns EM1, EM2, and EM3 may be formed through the deposition process using the mask MK (refer to FIG. 3) according to the embodiment of the disclosure. For example, the light emitting patterns EM1, EM2, and EM3 may be formed to respectively correspond to the pixels using a unit mask that is called a fine metal mask (FMM). The light emitting patterns EM1, EM2, and EM3 may be deposited to have a process margin, and each of the light emitting patterns EM1, EM2, and EM3 may cover an entire area of a corresponding light emitting opening in a plan view. Accordingly, even though the light emitting patterns EM1, EM2, and EM3 are shifted from target points while being deposited due to a misalignment of the mask MK (refer to FIG. 3), the area defined as the light emitting area may be sufficiently covered.

The light emitting patterns EM1, EM2, and EM3 may include an organic light emitting material, an inorganic light emitting material, a quantum dot, or a quantum rod. The light emitting patterns EM1, EM2, and EM3 of the first, second, and third light emitting elements OL1, OL2, and OL3 may emit lights having different colors from each other. For example, materials respectively included in the light emitting patterns EM1, EM2, and EM3 of the first, second, and third light emitting elements OL1, OL2, and OL3 may be different from each other and may be deposited using different masks MK (refer to FIG. 3), however, the embodiment is not limited thereto or thereby.

The hole control layer HCL may be disposed between the first electrodes AE1, AE2, and AE3 and the light emitting patterns EM1, EM2, and EM3. The hole control layer HCL may include at least one of a hole transport layer and a hole injection layer and may further include an electron blocking layer. The electron control layer ECL may be disposed between the light emitting patterns EM1, EM2, and EM3 and the second electrode CE. The electron control layer ECL may include at least one of an electron transport layer and an electron injection layer and may further include a hole blocking layer.

The hole control layer HCL and the electron control layer ECL may be commonly disposed in the light emitting areas LA1, LA2, and LA3 and the non-light-emitting area NLA. The hole control layer HCL and the electron control layer ECL, each of which is formed of a film, may be commonly deposited in the pixels using an open mask.

The second electrode CE of the first, second, and third light emitting elements OL1, OL2, and OL3 may be integral with each other and may be disposed on the light emitting patterns EM1, EM2, and EM3. For example, the second electrode CE of the first, second, and third light emitting elements OL1, OL2, and OL3 may be a common layer that serves as a common electrode. The second electrode CE may be disposed in the first, second, and third light emitting areas LA1, LA2, and LA3 and the non-light-emitting area NLA.

The encapsulation layer TFE may be disposed on the light emitting elements OL1, OL2, and OL3. The encapsulation layer TFE may include at least one thin layer that encapsulates and protects the light emitting elements OL1, OL2, and OL3 and/or improves the light emitting efficiency of the light emitting elements OL1, OL2, and OL3. For example, the encapsulation layer TFE may include at least one of an inorganic layer protecting the light emitting elements OL1, OL2, and OL3 from moisture and/or oxygen and an organic layer protecting the light emitting elements OL1, OL2, and OL3 from a foreign substance such as dust particles.

Figure 3:
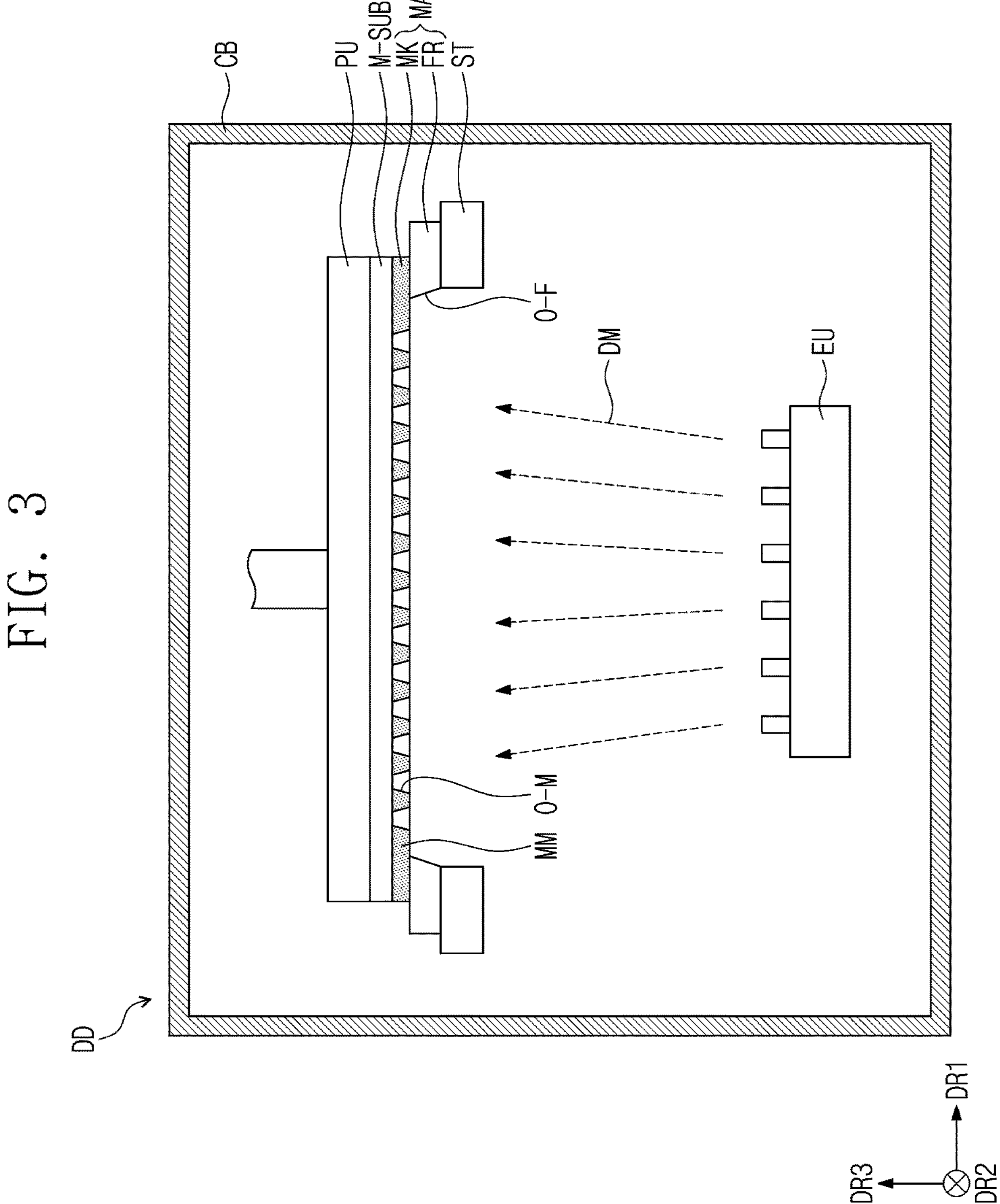
FIG. 3 is a schematic cross-sectional view of a deposition apparatus according to an embodiment of the disclosure.
Figure 4:
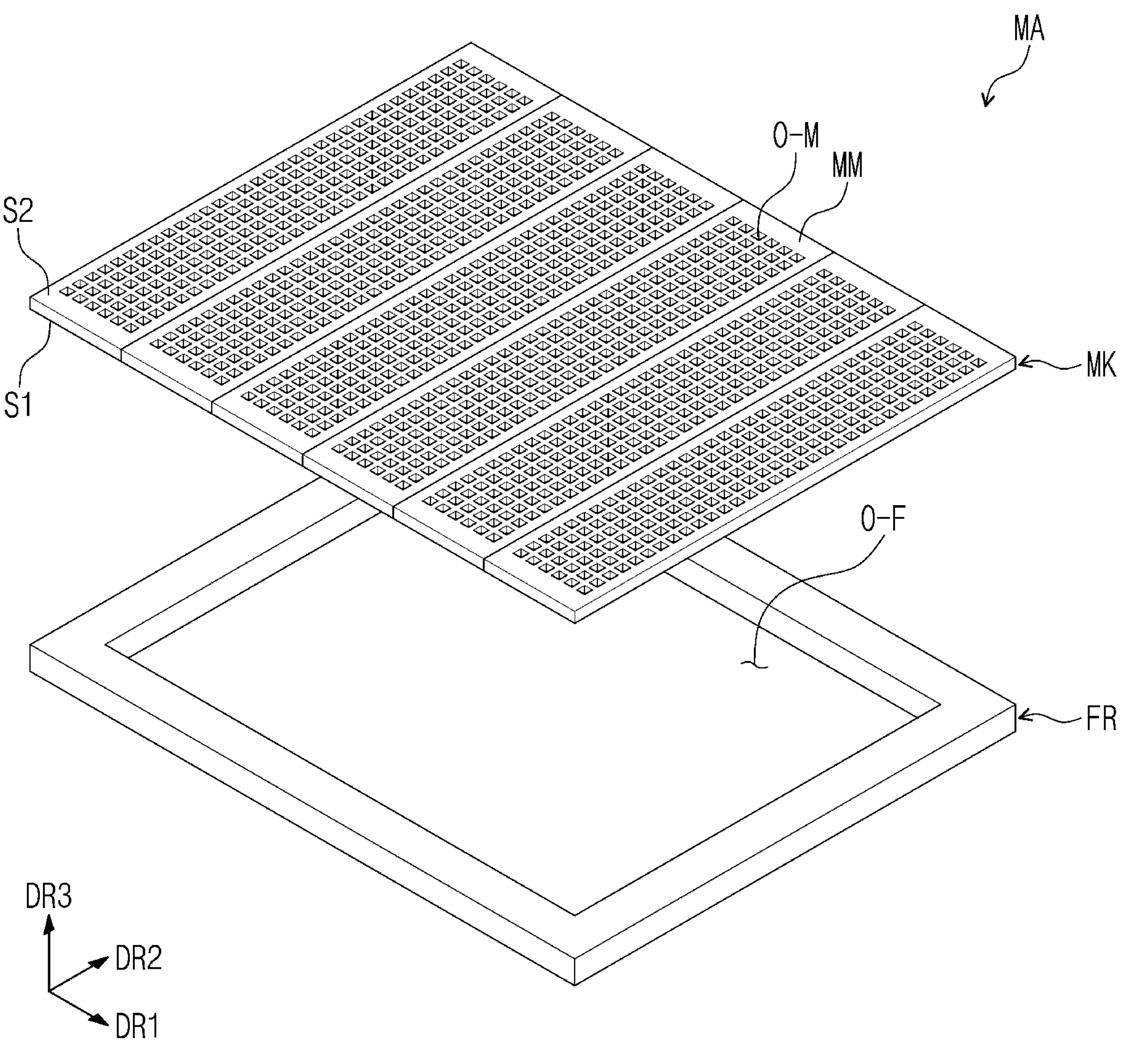
FIG. 4 is a perspective view of a mask assembly according to an embodiment of the disclosure.

FIG. 3 is a schematic cross-sectional view of a deposition apparatus DD according to an embodiment of the disclosure. FIG. 4 is a perspective view of a mask assembly MA according to an embodiment of the disclosure.

The deposition apparatus DD may be used to form some of functional layers included in the display panel DP (refer to FIG. 2). For example, the deposition apparatus DD may be used in a deposition process for the light emitting patterns EM1, EM2, and EM3 (refer to FIG. 2) of the display panel DP (refer to FIG. 2).

Referring to FIG. 3, the deposition apparatus DD may include a chamber CB, a deposition part EU, a fixing part PU, a stage ST, and the mask assembly MA. Although not shown in figures, the deposition apparatus DD may include additional mechanical apparatuses to implement an inline system.

The chamber CB may include a bottom surface, a ceiling surface, and sidewalls connecting the bottom surface and the ceiling surface to provide an inner space therein. The bottom surface of the chamber CB may be substantially parallel to a plane defined by the first direction DR1 and the second direction DR2. A normal line direction of the bottom surface of the chamber CB may be substantially parallel to the third direction DR3. In the expression "on a plane", the plane is set based on a plane parallel to the first and second directions DR1 and DR2.

The deposition part EU, the fixing part PU, the stage ST, the mask assembly MA, and a substrate M-SUB to be processed (hereinafter, referred to as a process substrate) may be disposed in the inner space of the chamber CB. The chamber CB may form an enclosed space, and a deposition condition of the chamber CB may be set to a vacuum state. The chamber CB may include at least one gate and may be opened or closed by the gate. The mask assembly MA and the process substrate M-SUB may enter and exit through the gate of the chamber CB.

The fixing part PU may be disposed above the deposition part EU in the chamber CB. The fixing part PU may fix the mask assembly MA. For example, the fixing part PU may include a jig or a robot arm to hold the mask assembly MA. The fixing part PU may include magnetic substances to attach the mask assembly MA to the process substrate M-SUB. For example, the magnetic substances may generate a magnetic force to apply an attractive force to the mask assembly MA, and thus, the process substrate M-SUB disposed between the mask assembly MA and the fixing part PU may be tightly fixed to the mask assembly MA.

The process substrate M-SUB may be a process target on which a deposition material DM is deposited. For example, the process substrate M-SUB may include a support substrate and a synthetic resin layer disposed on the support substrate and corresponding to the base substrate SUB (refer to FIG. 2). The support substrate may be removed in a later process of a manufacturing process of the display panel. The process substrate M-SUB may include components of the display panel DP (refer to FIG. 2) formed on the base substrate SUB (refer to FIG. 2) depending on components to be formed through the deposition process.

The deposition part EU may be disposed in the chamber CB to face the fixing part PU. The deposition part EU may include a space to accommodate the deposition material DM and at least one nozzle to spray the deposition material DM. The deposition material DM may include an inorganic material, a metal material, or an organic material that is sublimable or vaporable. The deposition material DM may be deposited on the process substrate M-SUB in a pattern after passing through the mask assembly MA.

Referring to FIGS. 3 and 4, the mask assembly MA may include a mask MK and a frame FR. The mask MK may be disposed on the frame FR and may be coupled with the frame FR.

The frame FR may support the mask MK. The frame FR may be provided with a frame opening O-F defined therethrough. The frame FR may have a closed line shape surrounding the frame opening O-F in a plan view. The shape of the frame FR is not particularly limited as long as the frame FR supports the mask MK.

The frame FR may have a rigidity. For example, the frame FR may include a metal, such as stainless steel (SUS), Invar alloy, nickel (Ni), cobalt (Co), etc., however, the material for the frame FR is not limited thereto or thereby.

The mask MK may include a mother member MM disposed on the frame FR, and the mother member MM may be provided with multiple openings O-M defined therethrough.

The mother member MM may include a first surface S1 and a second surface S2, which are substantially parallel to the first direction DR1 and the second direction DR2. The first surface S1 and the second surface S2 may be opposite to each other in the third direction DR3. The first surface S1 may face the frame FR, and a portion of the first surface S1, which is adjacent to an outer edge, may be supported by the frame FR. The second surface S2 may face the process target. For example, the second surface S2 may face the process substrate M-SUB of FIG. 3.

The openings O-M of the mask MK may be formed by removing a portion of the mother member MM to penetrate the mother member MM from the first surface S1 to the second surface S2. Inner side surfaces of the mother member MM may define the openings O-M, respectively. For example, as the openings O-M are formed through the mother member MM, the inner side surfaces of the mother member MM may be exposed to the outside, and the inner side surfaces may correspond to outer circumferential surfaces of the openings O-M, respectively.

The openings O-M of the mask MK may overlap the frame opening O-F in a plan view. The openings O-M of the mother member MM may define areas in which a deposition pattern is formed on the process substrate M-SUB. For example, the deposition material DM may be formed on a deposition surface of the process substrate M-SUB in a pattern corresponding to the openings O-M after passing through the frame opening O-F and the openings O-M of the mask MK. The deposition pattern may be the light emitting patterns EM1, EM2, and EM3 of the display panel DP (refer to FIG. 2).

The mother member MM of the mask MK may be provided in plural, and the mother members MM may be arranged in a direction to overlap the frame opening O-F. The mother members MM may be defined as unit masks, respectively, however, they are not limited thereto or thereby. According to an embodiment, the mother member MM may be provided as an integral plate.

The mother member MM of the mask MK may include a metal with a small coefficient of thermal expansion. For example, the mother member MM of the mask MK may include Invar alloy, nickel-cobalt alloy, nickel-iron alloy, etc., however, the material for the mask MK is not limited thereto or thereby.

Referring to FIG. 3, the stage ST may be disposed between the deposition part EU and the fixing part PU and may support the frame FR. The stage ST may be placed outside a moving path of the deposition material DM supplied from the deposition part EU to the process substrate M-SUB.

The stage ST may provide a seating surface on which the frame FR is placed, and the seating surface may be substantially parallel to the first direction DR1 and the second direction DR2. According to an embodiment, the seating surface of the stage ST may be provided to be parallel to the bottom surface of the chamber CB, and a vertical deposition process may be performed, however, the disclosure is not limited thereto or thereby. According to an embodiment, the seating surface of the stage ST may be provided to be perpendicular to the bottom surface of the chamber CB, and a horizontal deposition process may be performed.

Figure 5:
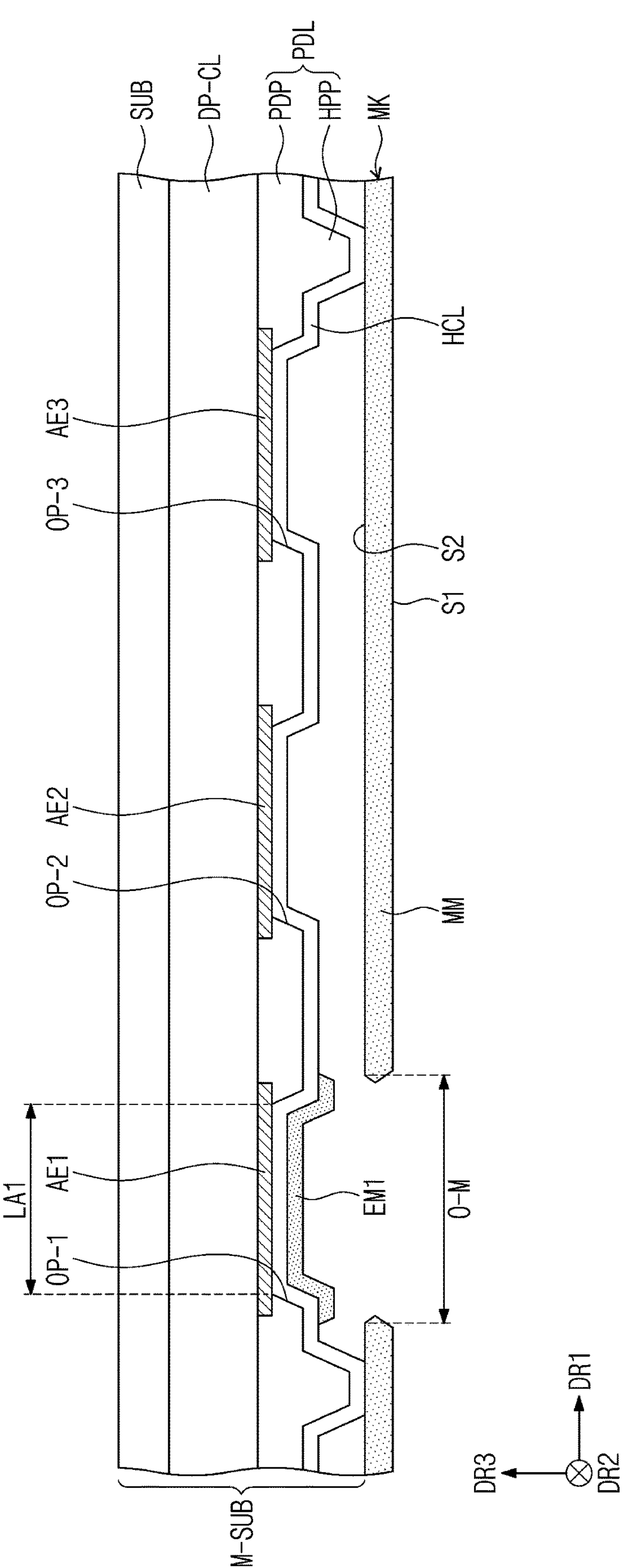
FIG. 5 is a schematic cross-sectional view of a deposition process according to an embodiment of the disclosure.

FIG. 5 is a schematic cross-sectional view of the deposition process according to an embodiment of the disclosure. FIG. 5 shows the deposition process to form the light emitting pattern EM1 of the display panel DP (refer to FIG. 2) as a representative example. Hereinafter, the light emitting pattern EM1 of the first light emitting element OL1 (refer to FIG. 2) will be referred to as a first light emitting pattern EM1.

The mask MK of FIG. 5 may be used in the deposition process to form the first light emitting pattern EM1. Hereinafter, descriptions of the mask MK may be applied to masks used to form other deposition patterns other than the first light emitting pattern EM1.

Referring to FIG. 5, the process substrate M-SUB may include the base substrate SUB, the circuit element layer DP-CL, the pixel definition layer PDL, the first electrodes AE1, AE2, and AE3, and the hole control layer HCL. In the embodiment shown in FIG. 5, the deposition surface of the process substrate M-SUB may be the surface on which the hole control layer HCL is deposited. However, components included in the process substrate M-SUB and components that provide the deposition surface thereon may be changed depending on the components to be formed using the deposition process.

The second surface S2 of the mother member MM may face the process substrate M-SUB, and the first surface S1 may be opposite to the second surface S2. The protruding portion HPP of the pixel definition layer PDL may support the second surface S2 of the mother member MM. As the protruding portion HPP protrudes from the pixel definition layer portion PDP to the mother member MM of the mask MK, the deposition surface corresponding to the first light emitting area LA1 may be spaced apart from the mask MK by a distance.

The opening O-M of the mask MK may be defined on the mother member MM to correspond to a position where the first light emitting pattern EM1 is formed. The opening O-M may overlap an area defined as the first light emitting area LA1 in the process substrate M-SUB. The opening O-M may have a size greater than a size of the first light emitting area LA1 in a plan view. Accordingly, a process margin of the first light emitting pattern EM1 may be sufficiently secured, and the first light emitting pattern EM1 may sufficiently cover the entire area of the first light emitting area LA1.

Since a size and a location of the deposition pattern formed on the process substrate M-SUB vary depending on a size and a location of the opening O-M of the mask MK, the size and location of the opening O-M may affect the reliability of the deposition process. Accordingly, the opening O-M may need to be formed through the mother member MM with a designed size at a designed location, or the mask may be classified as a defective mask and may be discarded without being used in the deposition process. The disclosure provides a method of repairing the defective mask to improve a production yield of the mask and a reliability of the deposition process, which will be described with reference to the following drawings.

Figure 6A:
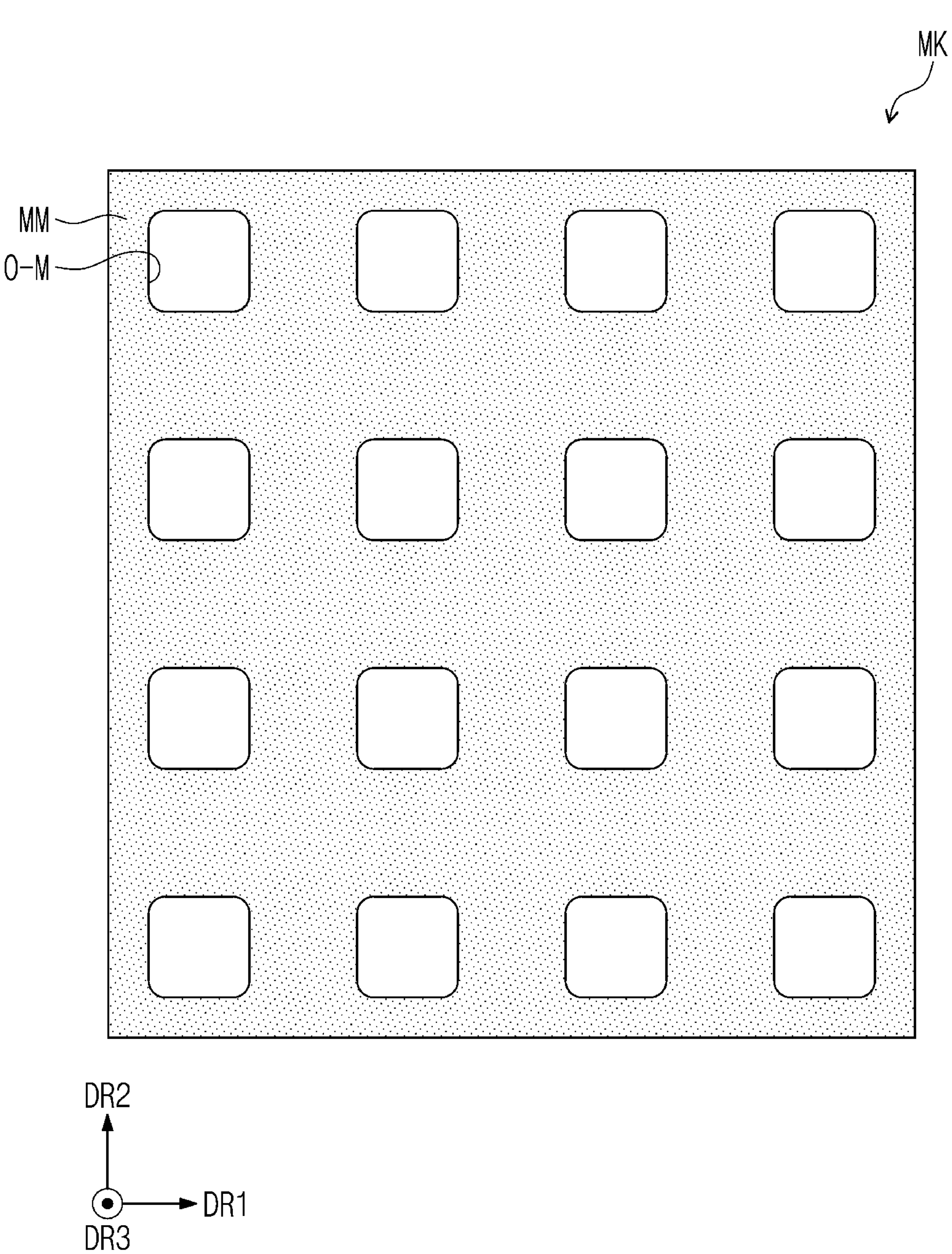
FIGS. 6A and 6B are plan views of masks according to embodiments of the disclosure.
Figure 6B:
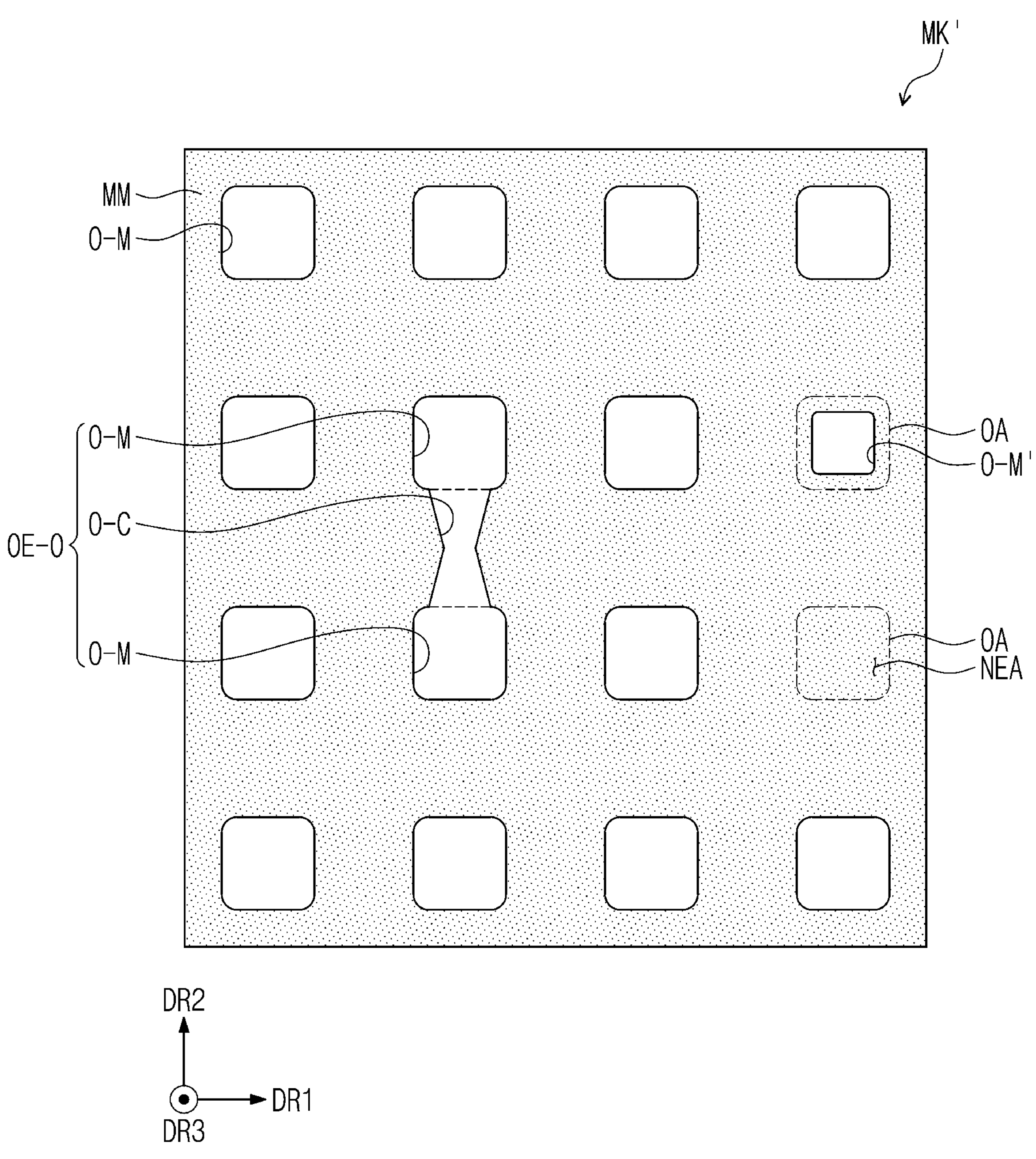

FIGS. 6A and 6B are plan views of masks MK and MK'. FIGS. 6A and 6B are enlarged plan views showing areas of the masks MK and MK', respectively.

FIG. 6A shows the mask MK in which the openings O-M are formed with a designed size at a designed position on the mother member MM. For example, FIG. 6A shows the mask MK without defects.

Referring to FIG. 6A, the openings O-M may be arranged in a direction in an arrangement. The openings O-M may have substantially the same shape and size as each other. For example, the openings O-M may have substantially the same shape and size within the process tolerance.

However, the disclosure is not limited thereto or thereby. According to an embodiment, the openings O-M may include a first group of openings having a first size and a first shape and a second group of openings having a second size and a second shape, which are different from the first size and the first shape. The openings of the first group may have the same size and shape as each other within the process tolerance, and the openings of the second group may have the same size and shape as each other within the process tolerance. The openings of the first group may have an array and a shape in common with each other, and the openings of the second group may have an array and a shape in common with each other. For example, the openings of the first group may have different arrangement and shape from those of the openings of the second group, however, the openings included in the same group may have the array and the shape in common with each other. Two different types of patterns may be substantially simultaneously formed using one mask. The number of the groups is not limited thereto, and the openings O-M may include more than three groups of openings.

The shape and size of the openings O-M may be designed in various ways depending on the shape and size of the deposition pattern to be formed using the mask MK and are not particularly limited.

FIG. 6B shows the mask MK' having various types of defects occurring in the manufacturing process of the mask. Hereinafter, the opening O-M having a designed size and formed at a designed location will be referred to as a normal opening O-M.

A target process areas OA may be defined in the mother member MM to correspond to the location and the shape of the openings O-M. The openings O-M may be formed by etching the process areas OA of the mother member MM. For example, the openings O-M may be formed by wet-etching the mother member MM in the process areas OA.

Accordingly, the normal openings O-M may be formed on the process areas OA. However, defects, such as, the process area OA is over-etched, is insufficiently etched, and is not etched, may occur in the process of etching the mother member MM. Therefore, some of the openings formed on the mask MK' may have a size different from that of the normal opening O-M.

Referring to FIG. 6B, in case that the process area OA of the mother member MM is over-etched, an over-processed opening OE-O having a size greater than a size of the normal opening O-M may be formed. The over-processed opening OE-O may be an opening that is formed to have a size larger than the designed size such that an area, which should not be opened, is opened. The difference in size described above is distinguished from the difference in size between the openings of the first group and the openings of the second group of the normal openings O-M, which are originally designed to have different areas, e.g., the openings of the first group may have the size greater than that of the openings of the second group. For example, an area between the normal openings O-M, which should not be etched, may also be etched to form a connection opening O-C connecting the normal openings O-M, and the normal openings O-M may be connected to the connection opening O-C, thereby forming the over-processed opening OE-O. In case that the mask MK' through which the over-processed opening OE-O is formed is used for the deposition process, the deposition pattern may be formed at an area where the deposition pattern should not be formed.

FIG. 6B shows the over-processed opening OE-O defined by two adjacent openings O-M that are connected to each other, however, the connection opening O-C may be expanded so that three or more openings O-M are connected to each other. The shape of the over-processed opening OE-O shown in FIG. 6B is merely an example, and the shape of the over-processed opening OE-O is not particularly limited as long as the size of the over-processing opening OE-O is greater than the designed size of the opening O-M such that the area which should not be etched are etched.

In case that the process area OA of the mother member MM is insufficiently etched, an insufficient opening O-M' having a size smaller than that of the normal opening O-M may be formed. For example, the insufficient opening O-M' may be formed on the process area OA defined in the mother member MM, and the insufficient opening O-M' may have the size smaller than that of the process area OA. In a case where the mask MK' through which the insufficient opening O-M' is formed is used in the deposition process, the deposition pattern may be insufficiently formed. The insufficient opening O-M' may be an opening that is formed to have a size smaller than the designed size, and the difference in size described above is distinguished from the difference in size between the openings of the first groups and the openings of the second group of the normal openings O-M, which are originally designed to have different areas, e.g., the openings of the first group may have the size smaller than that of the openings of the second group. In the embodiment, the number of the insufficient openings O-M' may be one or more, but the number of the insufficient openings O-M' may be smaller than the number of the normal openings O-M. For example, the number of the insufficient openings O-M' may be less than or equal to about 10% of the number of the normal openings O-M.

In the case where the process area OA of the mother member MM is not etched, an opening may not be formed at a position where the normal opening O-M is required to be formed. In the embodiment, an unetched area among the process areas OA may be defined as a non-processed area NEA. In a case where the mask MK' in which the non-processed area NEA is formed is used in the deposition process, the deposition pattern may not be formed in the area where the deposition pattern is required to be formed.

Accordingly, the mask MK' having at least one of the defects shown in FIG. 6B may not be used in the deposition process. In case that the defective mask MK' is discarded, additional costs may be incurred to re-manufacture the mask, and the production yield of the mask may be reduced. According to the repairing method of the mask of the disclosure, the defective mask MK' may be repaired to be used in the deposition process. Thus, the number of discarded masks may be reduced, and the production yield of the mask may be improved.

Figure 7:
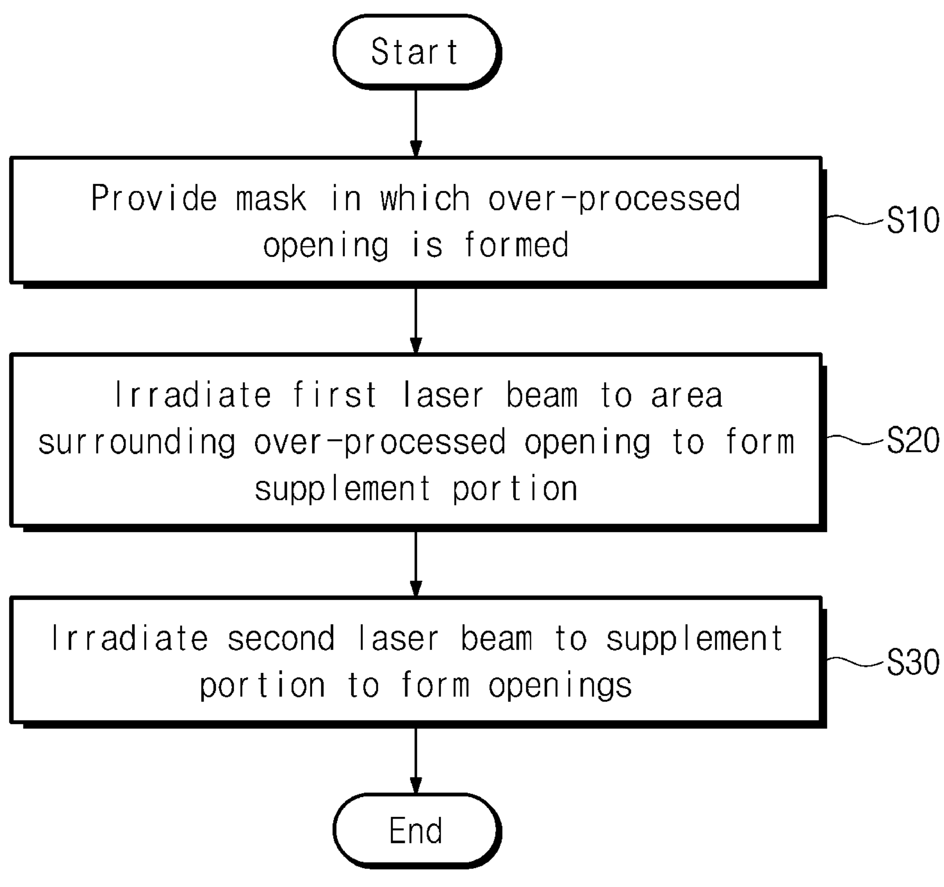
FIG. 7 is a flowchart of a method of repairing a mask according to an embodiment of the disclosure.

FIG. 7 is a flowchart of the repairing method of the mask according to an embodiment of the disclosure.

Referring to FIG. 7, the repairing method of the mask may include providing a mask through which the over-processed opening is formed (S10), irradiating a first laser beam to an area surrounding the over-processed opening to form a supplement portion (S20), and irradiating a second laser beam to the supplement portion to form multiple openings (S30).

The mask provided in the providing of the mask (S10) may be the defective mask in which the over-processed opening is formed. The defective mask provided in the providing of the mask (S10) may be the mask in which the insufficient opening or the non-processed area is formed as well as the over-processed opening.

In the forming of the supplement portion (S20), the supplement portion may be formed by irradiating the first laser beam to the area surrounding the over-processed opening of the mother member of the mask. A portion of the mother member to which the first laser beam is irradiated may be melted to form the supplement portion, and the supplement portion may fill at least a portion in the over-processed opening. For example, the supplement portion may fill at least the portion in the over-processed opening of the mother member, which corresponds to the area that should not be etched.

In the forming of the openings (S30), the openings may be formed by irradiating the second laser beam to the supplement portion. A portion of the supplement portion filled in the over-processed opening may be a portion required to be etched. The openings penetrating the supplement portion may be formed by irradiating the second laser beam in the portion of the supplement portion, which is required to be etched, and the openings may be spaced apart from each other with the supplement portion interposed therebetween. The openings formed in the forming of the openings (S30) may correspond to the normal openings. Accordingly, the over-processed opening formed on the defective mask may be repaired to become the normal openings, and the repaired mask may be used in the deposition process.

Hereinafter, each process of the repairing method of the mask will be described in detail with reference to accompanying drawings.

Figure 8A:
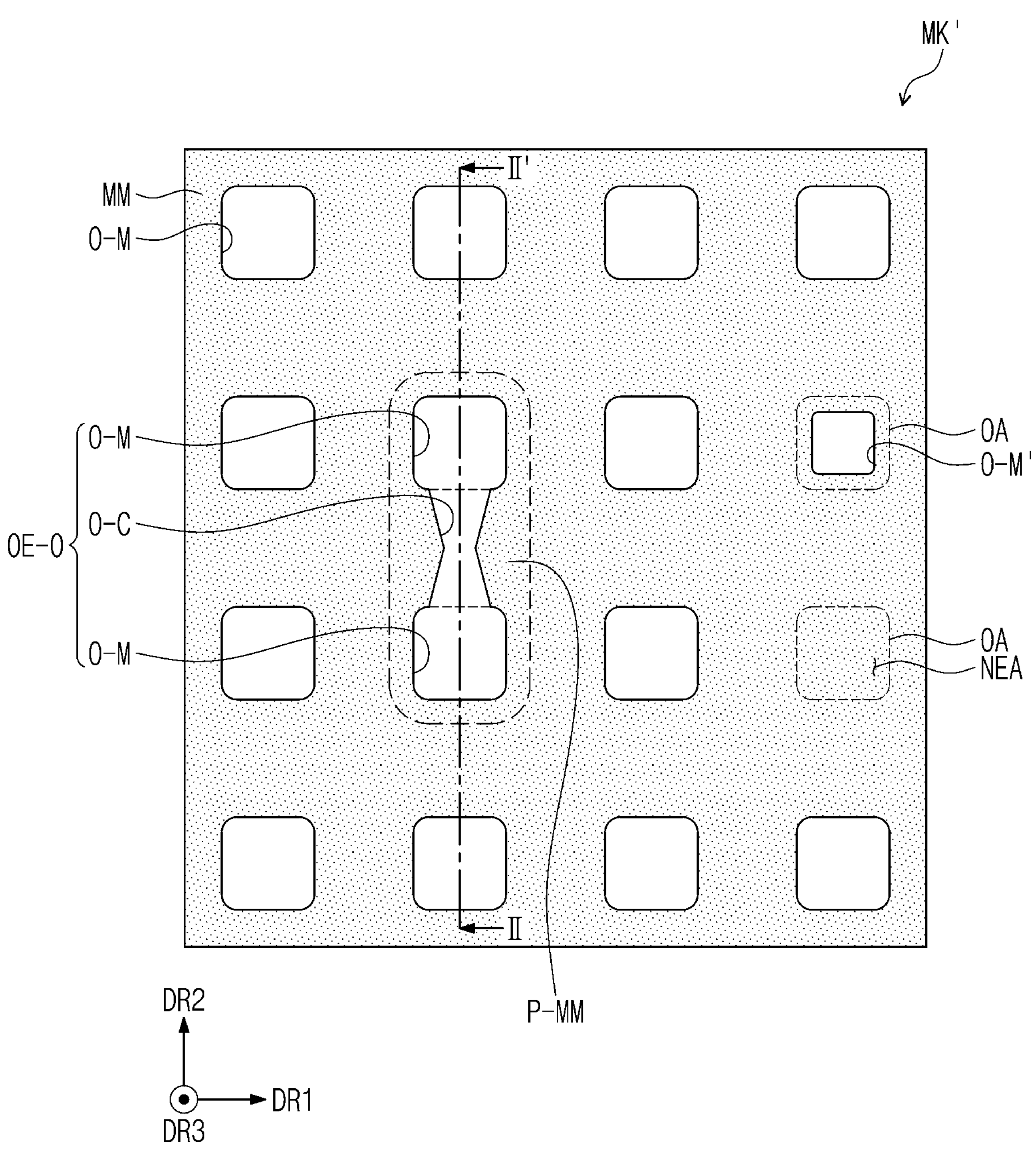
FIG. 8A is a plan view of a method of repairing a mask according to an embodiment of the disclosure.
Figure 8B:
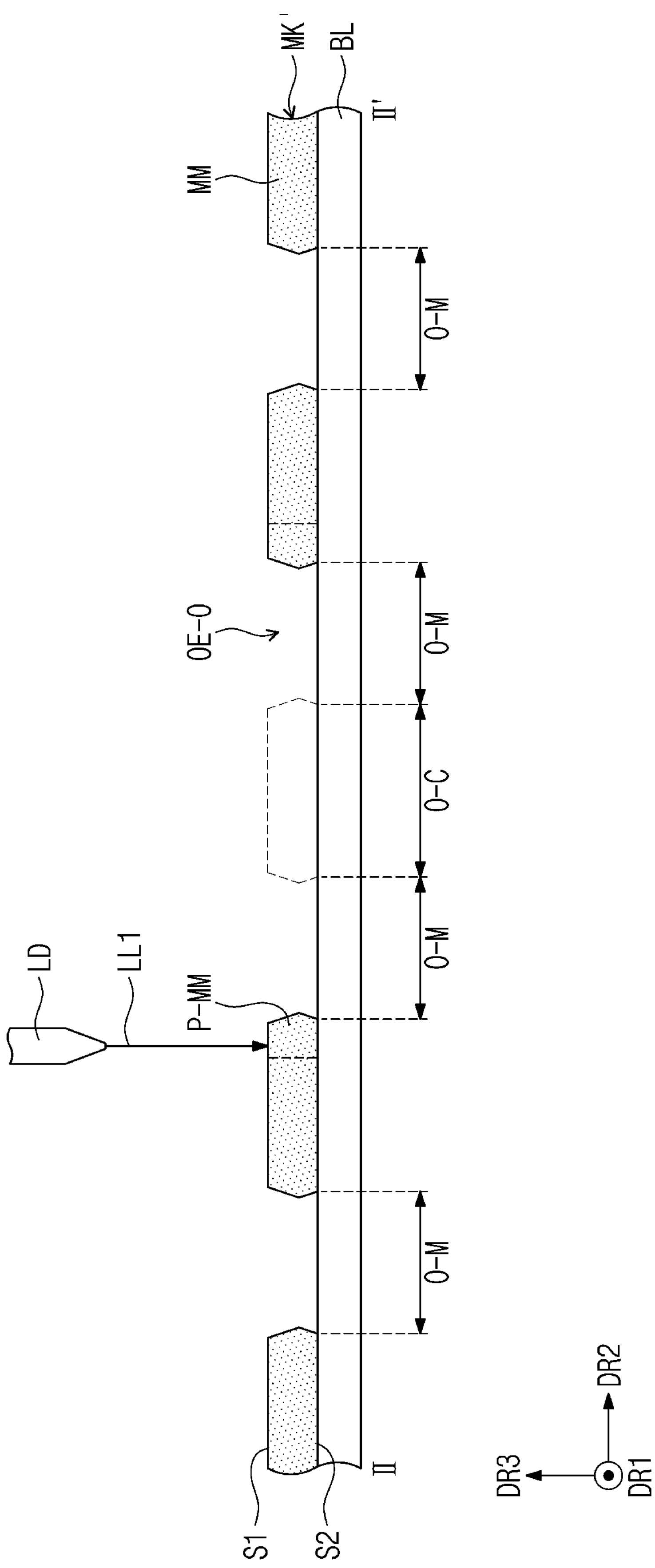
FIG. 8B is a schematic cross-sectional view of the mask taken along line II-II' of FIG. 8A according to an embodiment of the disclosure.

FIG. 8A is a plan view of a mask in the irradiating of the first laser beam. FIG. 8B is a schematic cross-sectional view of the mask taken along line II-II' of FIG. 8A according to an embodiment of the disclosure. FIG. 8A shows the mask MK' of FIG. 6B with defects in order to describe the method of repairing the mask.

Referring to FIGS. 8A and 8B, the mask MK' may be provided on a work stage BL, and thus the mask MK' may be supported by the work stage BL while being repaired. The second surface S2 of the mother member MM may be supported by the work stage BL, and the first surface S1 of the mother member MM may be opposite to the second surface S2 in the third direction DR3.

To repair the mask MK' through which the over-processed opening OE-O is formed, an area, which is spaced apart from the normal openings O-M adjacent to the over-processed opening OE-O and surrounds the over-processed opening OE-O, may be defined in the mother member MM. In the embodiment, the area surrounding the over-processed opening OE-O may be defined as a peripheral portion P-MM.

A light irradiation device LD may be disposed above the first surface S1. The light irradiation device LD may be disposed above the peripheral portion P-MM and may irradiate the first laser beam LL1 to the peripheral portion P-MM.

The first laser beam LL1 may have an intensity that partially melts the peripheral portion P-MM without removing the peripheral portion P-MM by vaporizing or subliming the peripheral portion P-MM. For example, the first laser beam LL1 may be a pulse laser beam with a pulse width (or a pulse duration) of microsecond or nanosecond. Accordingly, the peripheral portion P-MM to which the first laser beam LL1 is irradiated may be partially melted without being removed.

Figure 9A:
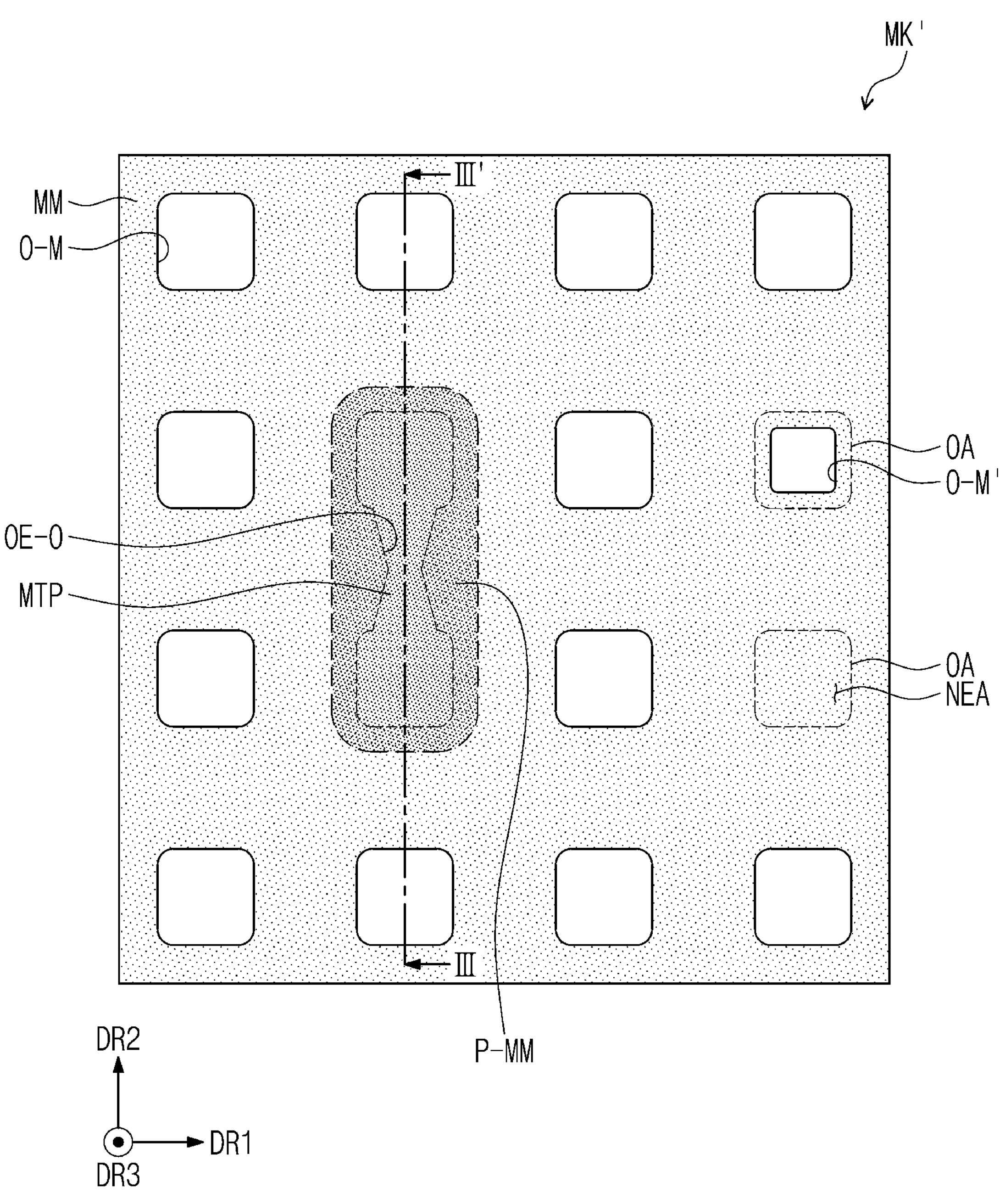
FIGS. 9A and 9B are plan views of a method of repairing a mask according to an embodiment of the disclosure.
Figure 9B:
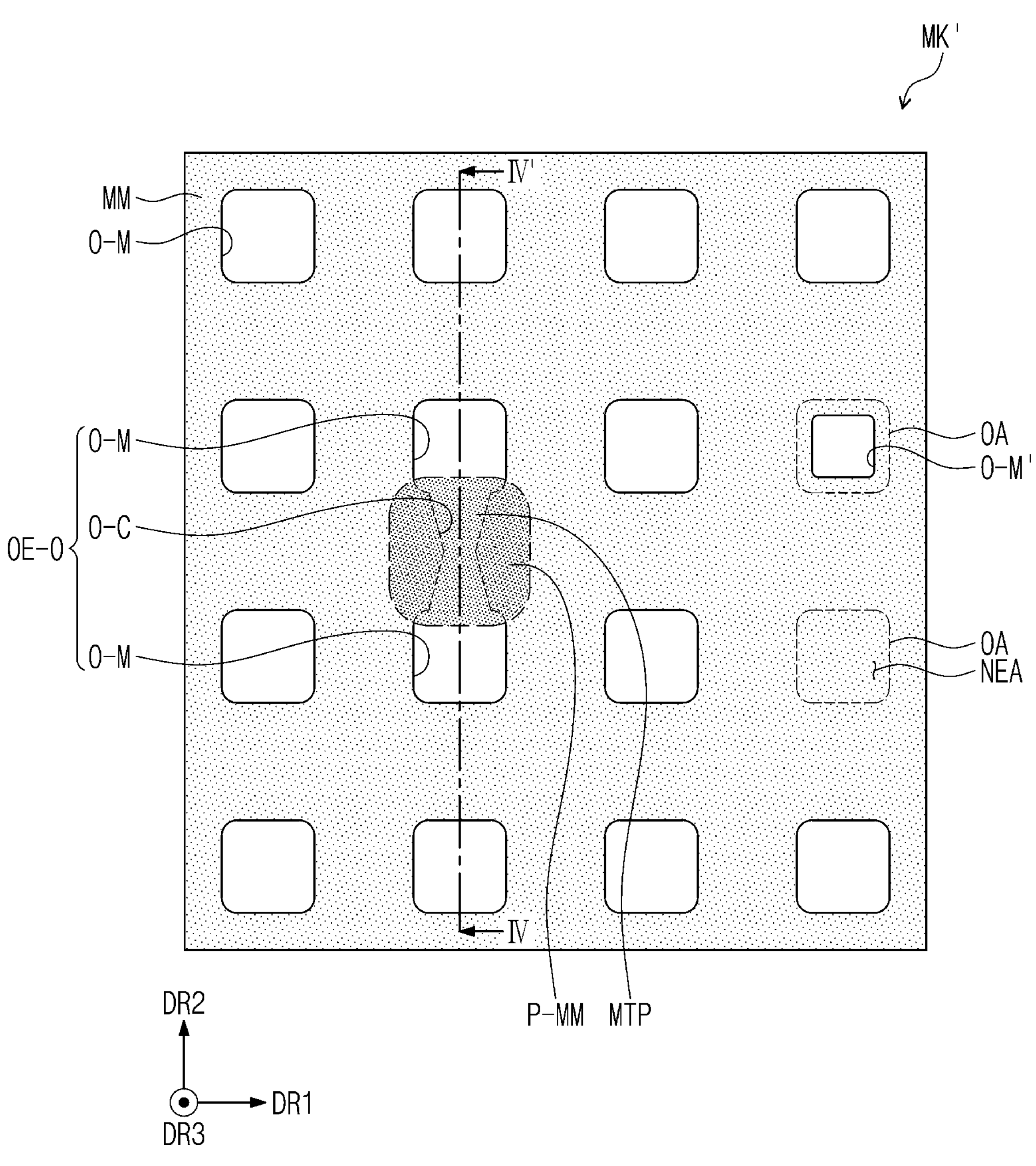
Figure 9C:
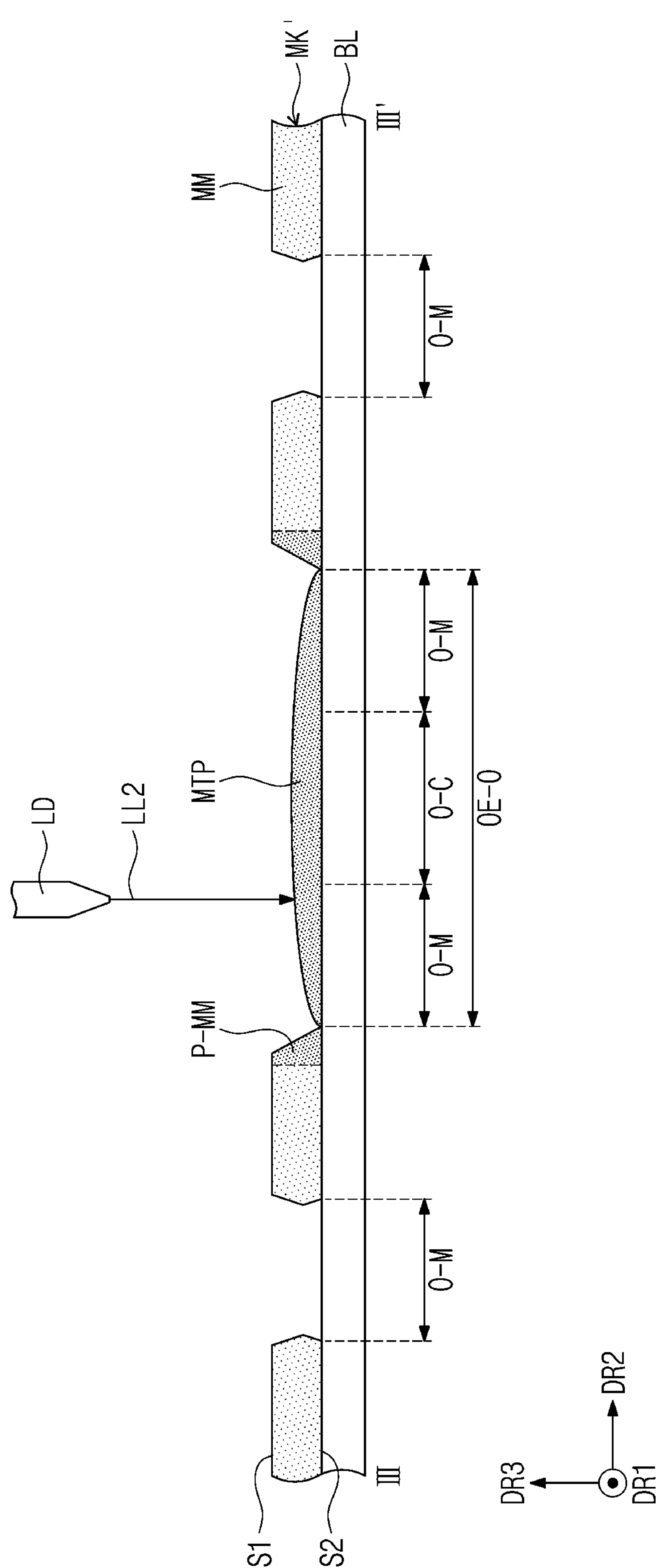
FIG. 9C is a schematic cross-sectional view of the mask taken along line of FIG. 9A according to an embodiment of the disclosure.
Figure 9D:
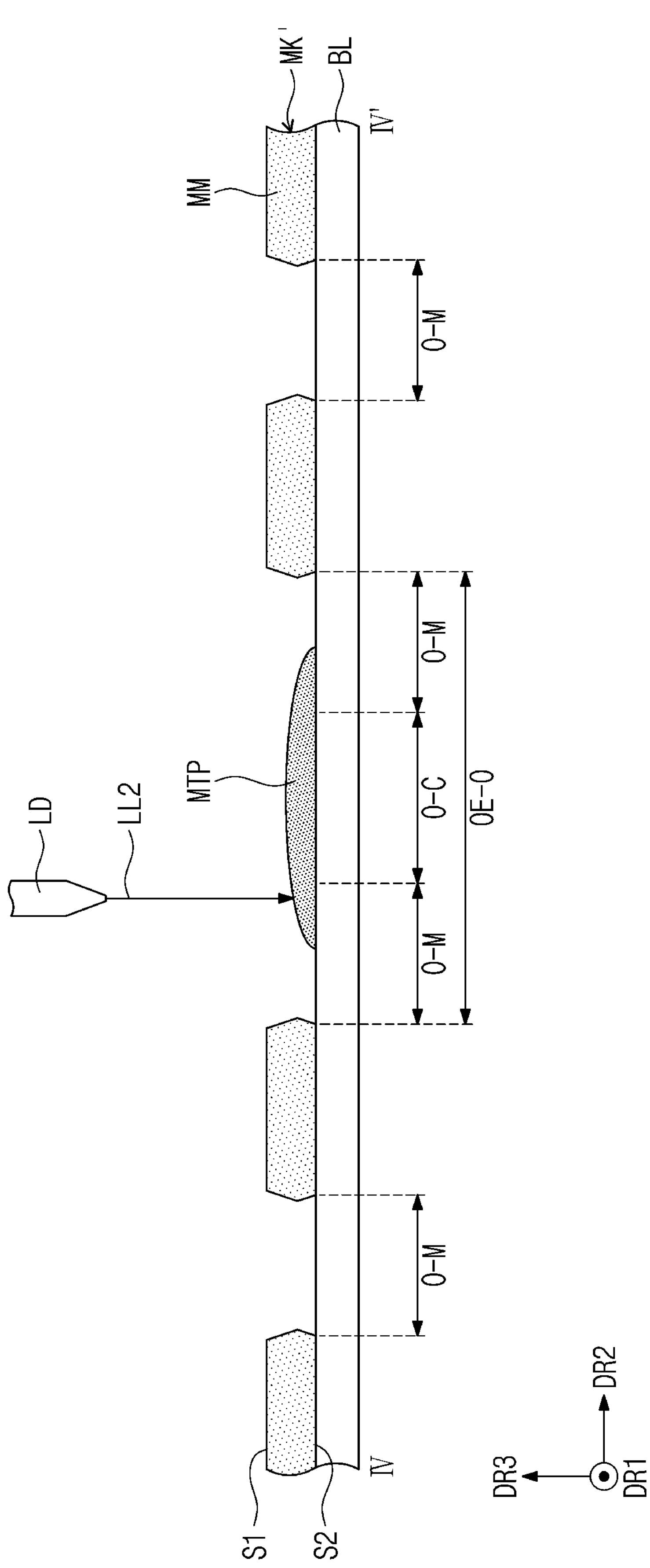
FIG. 9D is a schematic cross-sectional view of a mask taken along line IV-IV' of FIG. 9B according to an embodiment of the disclosure.

FIGS. 9A and 9B are plan views of masks MK' each in which the supplement portion MTP is formed (S20, refer to FIG. 7) according to embodiments of the disclosure. FIG. 9C is a schematic cross-sectional view of the mask taken along line of FIG. 9A according to an embodiment of the disclosure. FIG. 9D is a schematic cross-sectional view of the mask taken along line IV-IV' of FIG. 9B according to an embodiment of the disclosure.

Referring to FIGS. 9A to 9D, the portion of the peripheral portion P-MM may be melted by the first laser beam LL1 (refer to FIG. 8B), and the supplement portion MTP may be formed. For example, the supplement portion MTP may be formed by melting a portion of the mother member MM. The supplement portion MTP formed by melting the peripheral portion P-MM may be filled in at least the portion of an inner space of the over-processed opening OE-O. For example, the supplement portion MTP may be filled in the area corresponding to at least the portion of the over-processed opening OE-O.

As the embodiment shown in FIG. 9A, the supplement portion MTP may be formed over an entire area corresponding to the over-processed opening OE-O and may be connected to the peripheral portion P-MM, however, the disclosure is not limited thereto or thereby. As the embodiment shown in FIG. 9B, the supplement portion MTP may be formed to fill an area corresponding to the connection opening O-C of the over-processed opening OE-O. The area where the supplement portion MTP is formed may vary depending on a size of the area to which the first laser beam LL1 (refer to FIG. 8B) is irradiated or the intensity of the first laser beam LL1 (refer to FIG. 8B). The supplement portion MTP melted from the peripheral portion P-MM may be connected to the mother member MM in the area corresponding to the connection opening O-C and may be filled in the area in which an opening should not be formed.

Referring to FIGS. 9C and 9D, since an inner side surface of the peripheral portion P-MM, which defines the over-processed opening OE-O, is partially melted by the first laser beam LL1 (refer to FIG. 8B), the shape of the peripheral portion P-MM may be changed, or the thickness of the peripheral portion P-MM may decrease in the area to which the first laser beam LL1 (refer to FIG. 8B) is irradiated. The supplement portion MTP may be formed by melting the portion of the peripheral portion P-MM, and thus, a thickness at a center of the supplement portion MTP may be less than the thickness of the mother member MM before the first laser beam LL1 (refer to FIG. 8B) is irradiated.

The supplement portion MTP may be formed in the area corresponding to the normal opening O-M connected to the connection opening O-C as well as the area corresponding to the connection opening O-C. Accordingly, a portion of the supplement portion MTP corresponding to the normal opening O-M may need to be reprocessed.

The light irradiation device LD may be provided above the supplement portion MTP to process the supplement portion MTP. The light irradiation device LD may irradiate the second laser beam LL2 to the portion of the supplement portion MTP, which corresponds to the area where the normal opening O-M is required to be formed.

The second laser beam LL2 may have the intensity stronger (or greater) than the intensity of the first laser beam LL1. The second laser beam LL2 may have the intensity appropriate to remove by sublimating or vaporizing the portion of the supplement portion MTP to which the laser beam is irradiated. For example, the second laser beam LL2 may be a pulse laser beam with a pulse width (or a pulse duration) of picosecond or femtosecond. Accordingly, the portion of the supplement portion MTP to which the second laser beam LL2 is irradiated may be removed in the thickness direction.

Figure 10A:
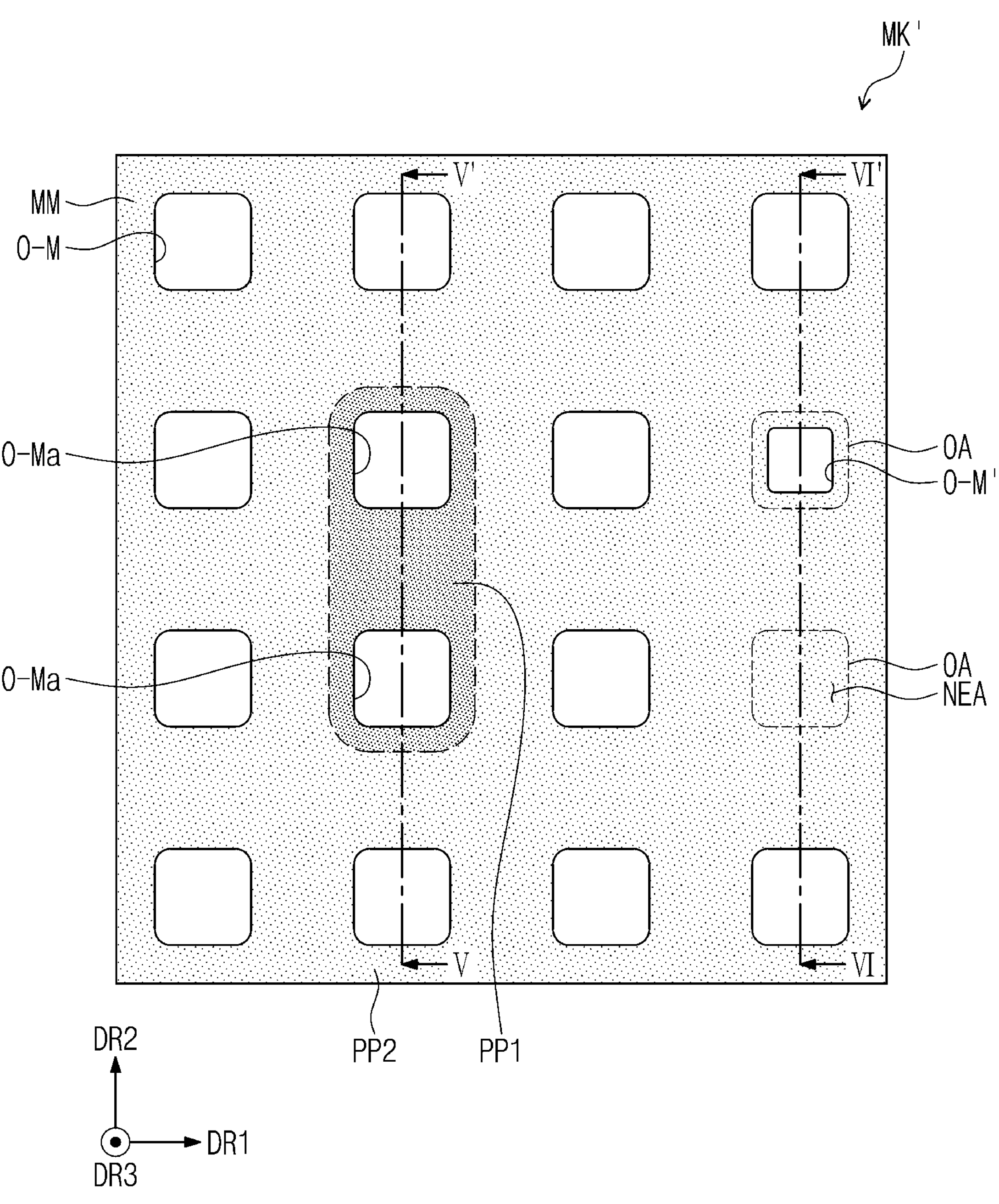
FIG. 10A is a plan view of a method of repairing a mask according to an embodiment of the disclosure.
Figure 10B:
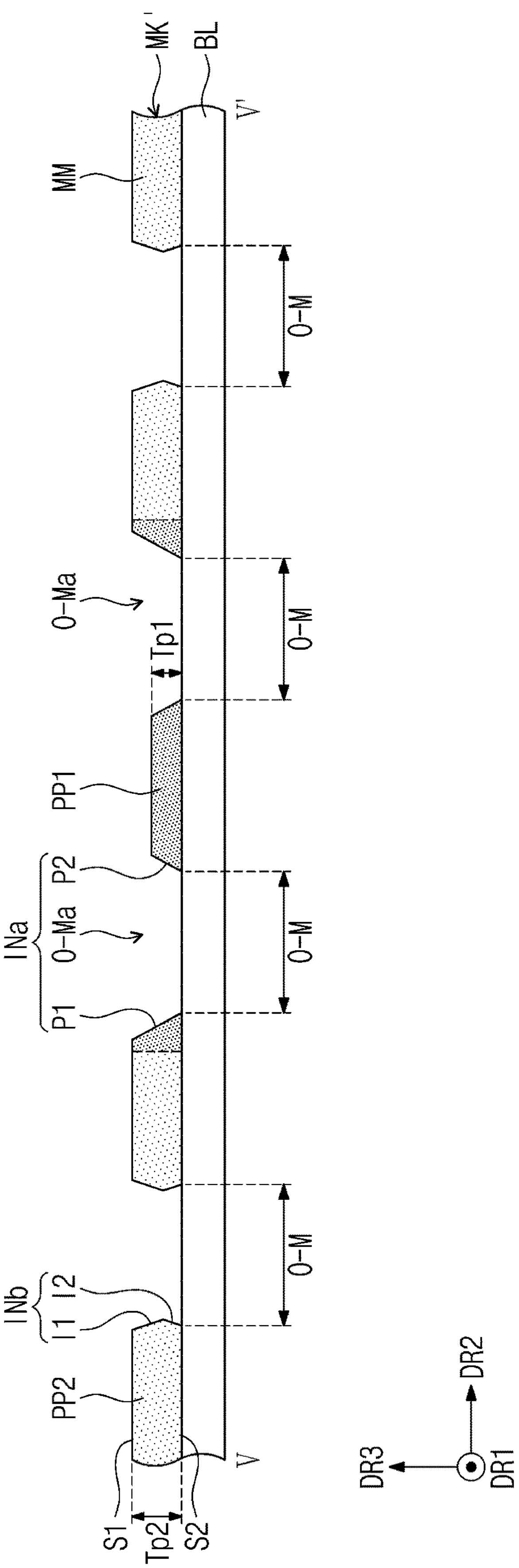
FIG. 10B is a schematic cross-sectional view of the mask taken along line V-V' of FIG. 10A according to an embodiment of the disclosure.

FIG. 10A is a plan view of a mask in the process of forming the openings through the supplement portion (S30, refer to FIG. 7). FIG. 10B is a schematic cross-sectional view taken along line V-V' of FIG. 10A. FIG. 10A shows the mask MK' whose defect, such as the formation of the over-processed opening OE-O, is repaired.

Referring to FIG. 10A, the second laser beam LL2 (refer to FIG. 9B) may be irradiate to an area of the supplement portion MTP (refer to FIG. 9B) where the normal opening O-M is required to be formed, and thus, the openings may be formed on the supplement portion MTP (refer to FIG. 9B). In the disclosure, openings O-Ma formed by processing the supplement portion MTP (refer to FIG. 9B) may be referred to as first repairing openings O-Ma.

The first repairing openings O-Ma may be formed to respectively correspond to the areas where the normal openings O-M are required to be formed. Accordingly, the first repairing openings O-Ma may be arranged in a direction with the normal openings O-M. The first repairing openings O-Ma and the normal openings O-M may have substantially the same size and shape within a process tolerance.

The first repairing openings O-Ma may be spaced apart from each other with a first portion PP1, which is formed from the supplement portion MTP (refer to FIG. 9A), interposed therebetween. The first portion PP1 may be connected to a portion of the mother member MM, which is not processed in the repairing process of the mask MK', and may form a portion of the mother member MM. In the disclosure, the portion of the mother member MM, which is not processed in the repairing process of the mask MK', may be referred to as a second portion PP2.

Referring to FIG. 10B, the first portion PP1 may be disposed between the first repairing openings O-Ma. The first portion PP1 formed from the supplement portion MTP (refer to FIG. 9C) may have a thickness Tp1 smaller than a thickness Tp2 of the second portion PP2. Accordingly, the first surface S1 of the mother member MM may have a step difference in the area where the first portion PP1 is formed. However, the second surface S2 opposite to the first surface S1 may be supported by the work stage BL when the first portion PP1 is formed, and thus, the second surface S2 may be flat in the area between the openings O-M and O-Ma.

Each of a first inner side surface INa of the mother member MM, which is exposed through the first repairing opening O-Ma, and a second inner side surface INb of the mother member MM, which is exposed through the normal opening O-M, may connect the first surface S1 to the second surface S2. The first inner side surface INa may correspond to an outer circumferential surface of the first repairing opening O-Ma, and the second inner side surface INb may correspond to an outer circumferential surface of the normal opening O-M.

The first inner side surface INa may include a first portion surface P1 and a second portion surface P2 facing the first portion surface P1 in the second direction DR2. In the third direction DR3, a length of the first portion surface P1 may be different from a length of the second portion surface P2. For example, the first inner side surface INa may have the length that varies in the third direction DR3 along the outer circumferential surface of the first repairing opening O-Ma. However, the disclosure is not limited thereto or thereby, and the length of the first portion surface P1 and the length of the second portion surface P2 may be substantially the same.

The first repairing opening O-Ma may be formed on the first portion PP1 having a relatively small thickness in the mother member MM, and thus, in the third direction DR3, a length of at least a portion of the first inner side surface INa may be smaller than a length of the second inner side surface INb.

The first repairing opening O-Ma may have a width that increases going from the second surface S2 to the first surface S1. For example, a distance between the first portion surface P1 and the second portion surface P2 may increase going from the second surface S2 to the first surface S1. As the first repairing opening O-Ma is processed using the laser beam, the first inner side surface INa may have an inclination surface that is substantially flat.

The second inner side surface INb may include a first inclination surface I1 bent from the first surface S1 and a second inclination surface I2 bent from the second surface S2 and connected to the first inclination surface I1. The first inclination surface I1 may be inclined in a direction different from a direction in which the second inclination surface I2 is inclined.

The normal opening O-M may have a width that increases as a distance from the first surface S1 decreases in an area corresponding to the first inclination surface I1. The normal opening O-M may have a width that decreases as a distance from the first surface S1 decreases in an area corresponding to the second inclination surface I2. Since the normal opening O-M is processed by a wet-etching process, the inclination surfaces I1 and I2 of the second inner side surface INb may be inclined in different directions from each other.

FIGS. 11A to 12C are schematic cross-sectional views of the repairing method of the mask according to an embodiment of the disclosure. The repairing method of the mask may include providing a metal powder PW in the over-processed opening before the first laser beam is irradiated. Hereinafter, the repairing method of the mask, which includes the providing of the metal powder PW, will be described with reference to FIGS. 11A to 12C.

Figure 11A:
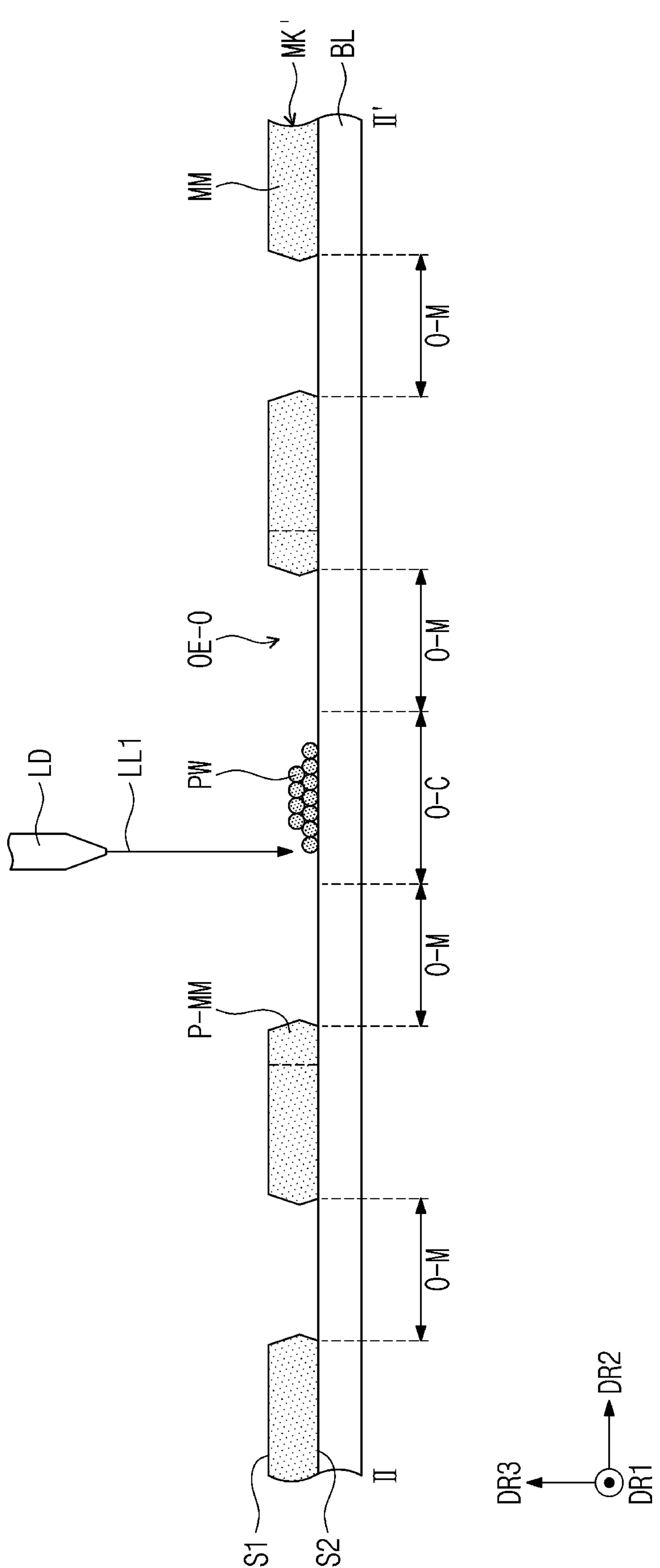
FIGS. 11A to 11C are schematic cross-sectional views of a method of repairing a mask according to an embodiment of the disclosure.

FIG. 11A is a schematic cross-sectional view of the mask MK' to which the metal powder PW is applied. Referring to FIG. 11A, the metal powder PW may be provided in the over-processed opening OE-O. The metal powder PW and the mother member MM may include a same material. For example, the metal powder PW may include Invar alloy. However, the material for the metal powder PW is not limited thereto or thereby.

The light irradiation device LD may irradiate the first laser beam LL1 to the metal powder PW and the peripheral portion P-MM. The metal powder PW may be melted with the peripheral portion P-MM to supplement the melted peripheral portion P-MM.

Figure 11B:
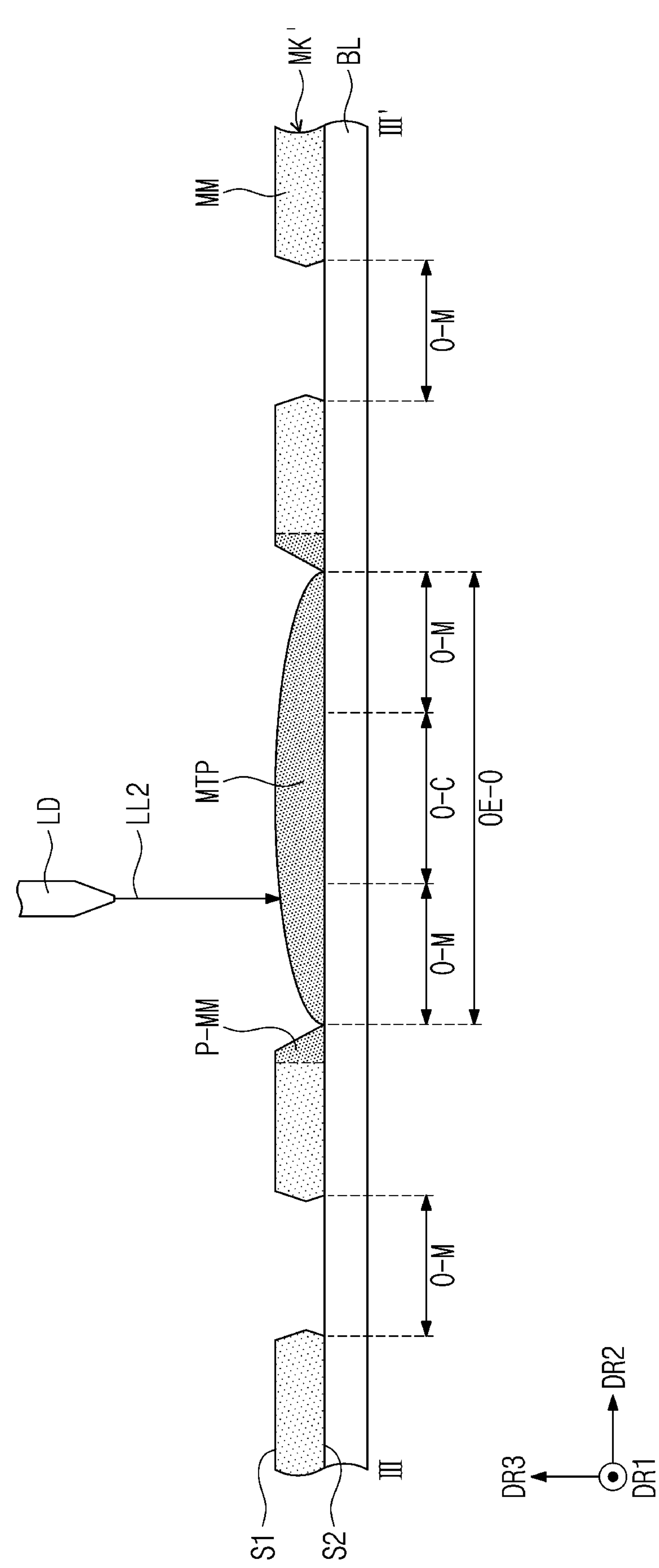

FIG. 11B is a schematic cross-sectional view of the mask MK' in which the supplement portion MTP is formed (S20, refer to FIG. 7). Referring to FIG. 11B, the supplement portion MTP may be formed by melting the peripheral portion P-MM and the metal powder PW. In case that the supplement portion MTP is formed within the over-processed openings of the same area, the thickness of the supplement portion MTP may be relatively greater in case that the metal powder PW is additionally provided than the case where only the peripheral portion P-MM is melted. For example, since the metal powder PW is additionally provided, the supplement portion MTP may be formed to sufficiently fill the over-processed opening OE-O. In the case where only the peripheral portion P-MM is melted without providing the metal powder PW, a repairing cost of the mask may be reduced.

The second laser beam LL2 may be irradiated to the supplement portion MTP to process a portion of the supplement portion MTP, which overlaps the area where the normal opening O-M is formed. Details of the irradiating of the second laser beam LL2 to the supplement portion MTP are the same as the details described above.

Figure 11C:
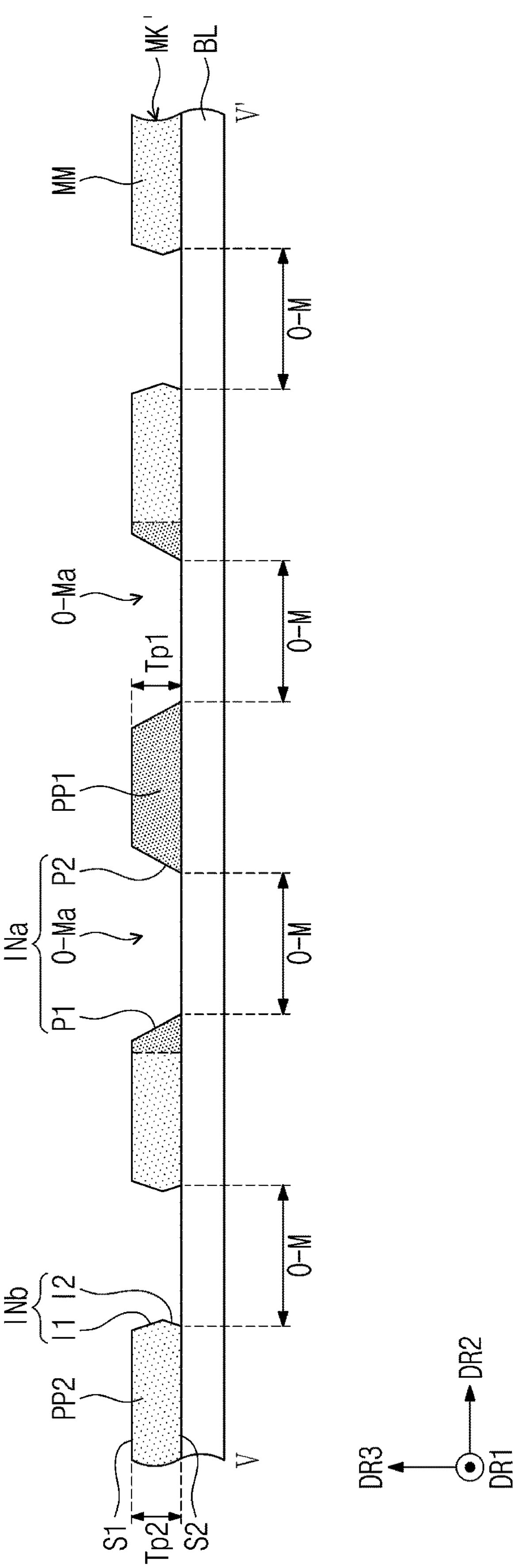

FIG. 11C is a schematic cross-sectional view of the mask MK' provided with the first repairing openings O-Ma formed by processing the supplement portion MTP (refer to FIG. 11B). As the thickness of the supplement portion MTP (refer to FIG. 11B) increases, the thickness Tp1 of the first portion PP1 formed from the supplement portion MTP (refer to FIG. 11B) may increase. The thickness Tp1 of the first portion PP1 may be similar to the thickness Tp2 of the second portion PP2 by controlling an amount of the metal power PW when the first portion PP1 is formed.

Figure 12A:
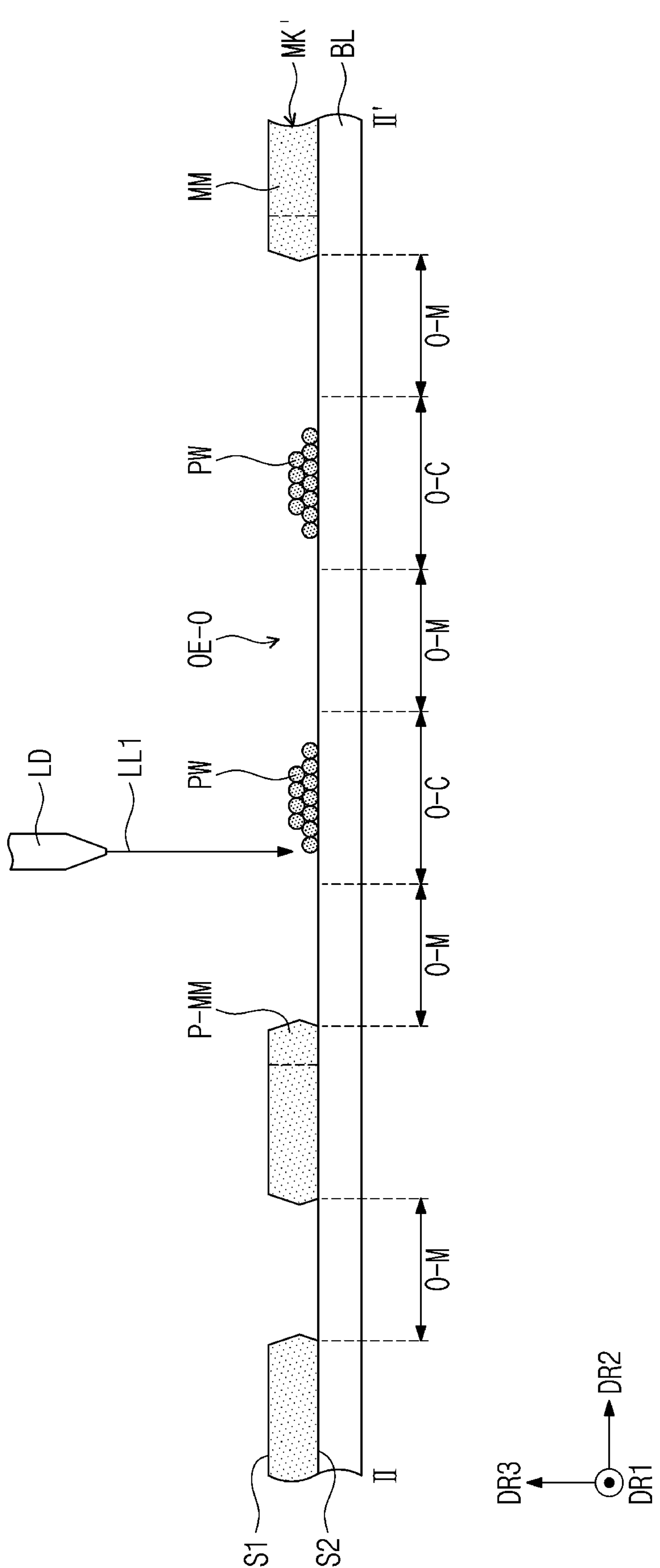
FIGS. 12A to 12C are schematic cross-sectional views of a method of repairing a mask according to an embodiment of the disclosure.

Referring to FIG. 12A, the size of the over-processed opening OE-O may be greater than that shown in FIG. 8B. In case that the size of the over-processed opening OE-O increases, it may be insufficient to fill the over-processed opening OE-O by melting only the peripheral portion P-MM. The metal powder PW may be provided in the over-processed opening OE-O. The metal powder PW and the peripheral portion P-MM may be melted by using the first laser beam LL1.

Figure 12B:
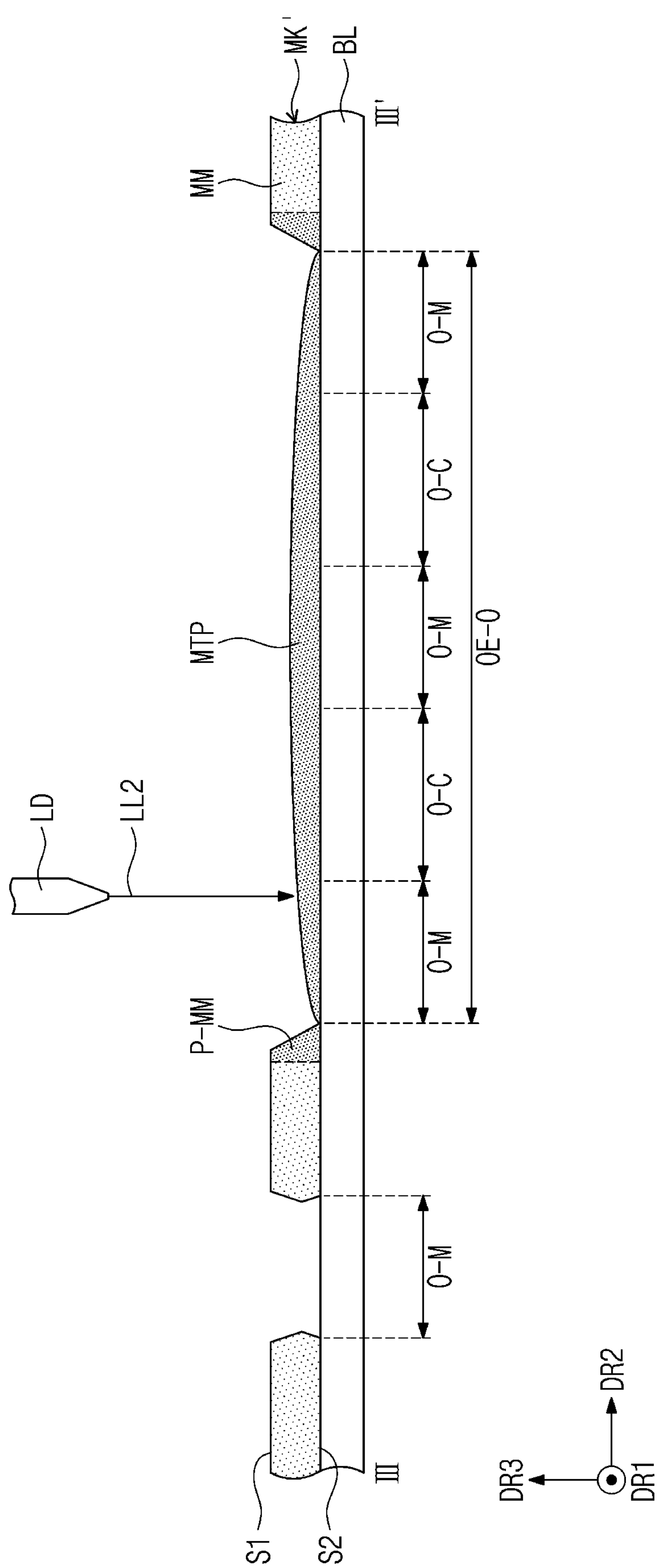

Referring to FIGS. 12A and 12B, as the metal powder PW and the peripheral portion P-MM are melted, the supplement portion MTP that fills the over-processed opening OE-O with the large area may be formed. The supplement portion MTP may overlap areas where three or more normal openings O-M are formed. The supplement portion MTP overlapping the areas where the normal openings O-M are formed may be processed by using the second laser beam LL2.

Figure 12C:
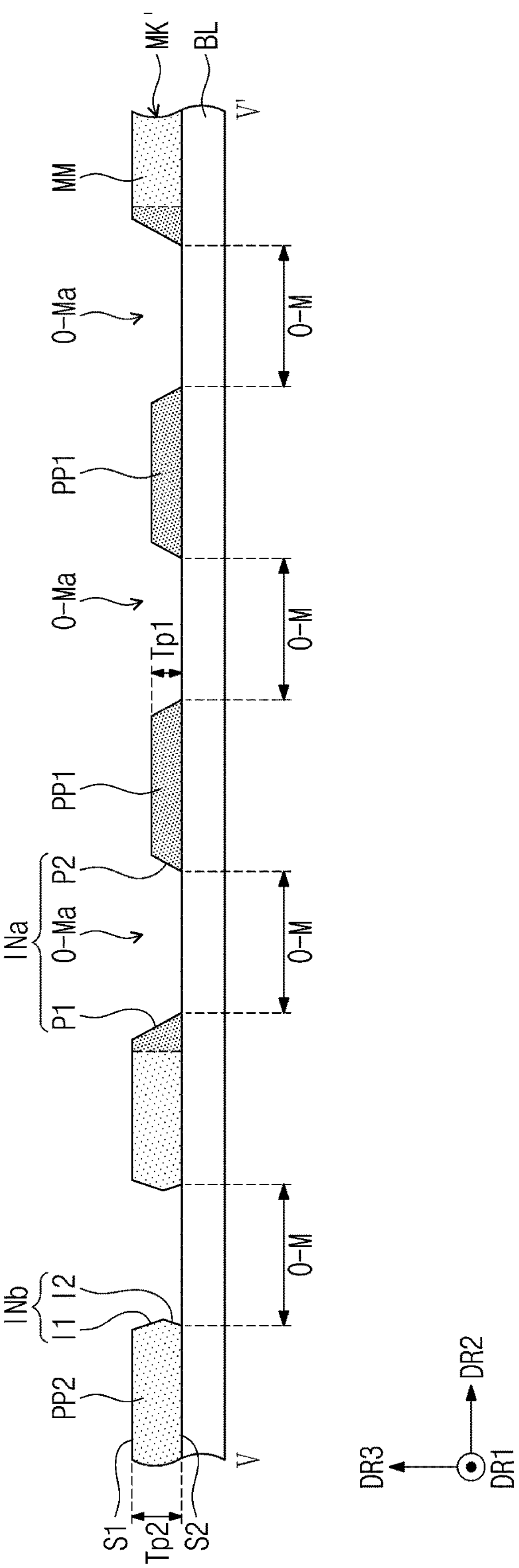

Referring to FIGS. 12B and 12C, the first repairing openings O-Ma may be formed by processing the supplement portion MTP. The details of process illustrated in FIGS. 12B and 12C may be the same as those described above except that the size of the over-processed opening OE-O increases and the number of the repaired openings increases.

Figure 13A:
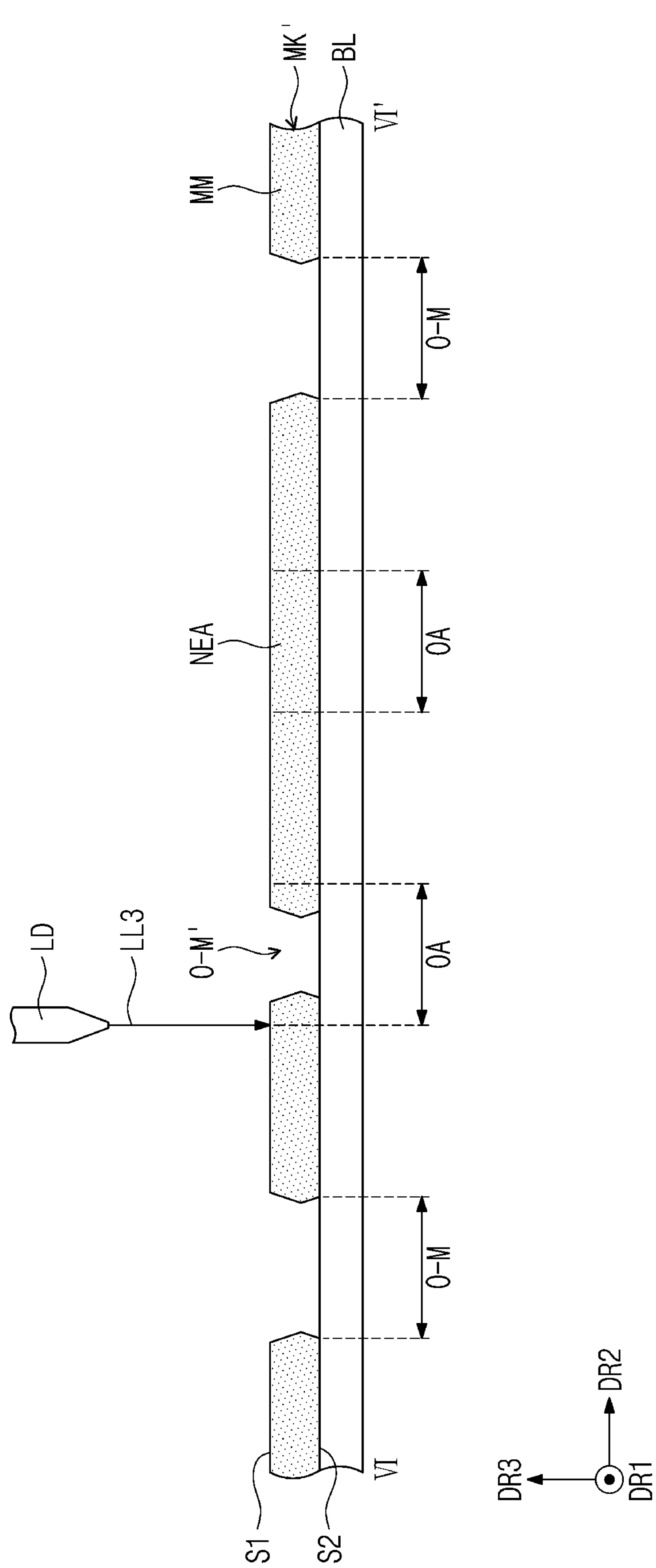
FIGS. 13A to 13C are schematic cross-sectional views of a method of repairing a mask according to an embodiment of the disclosure.
Figure 13B:
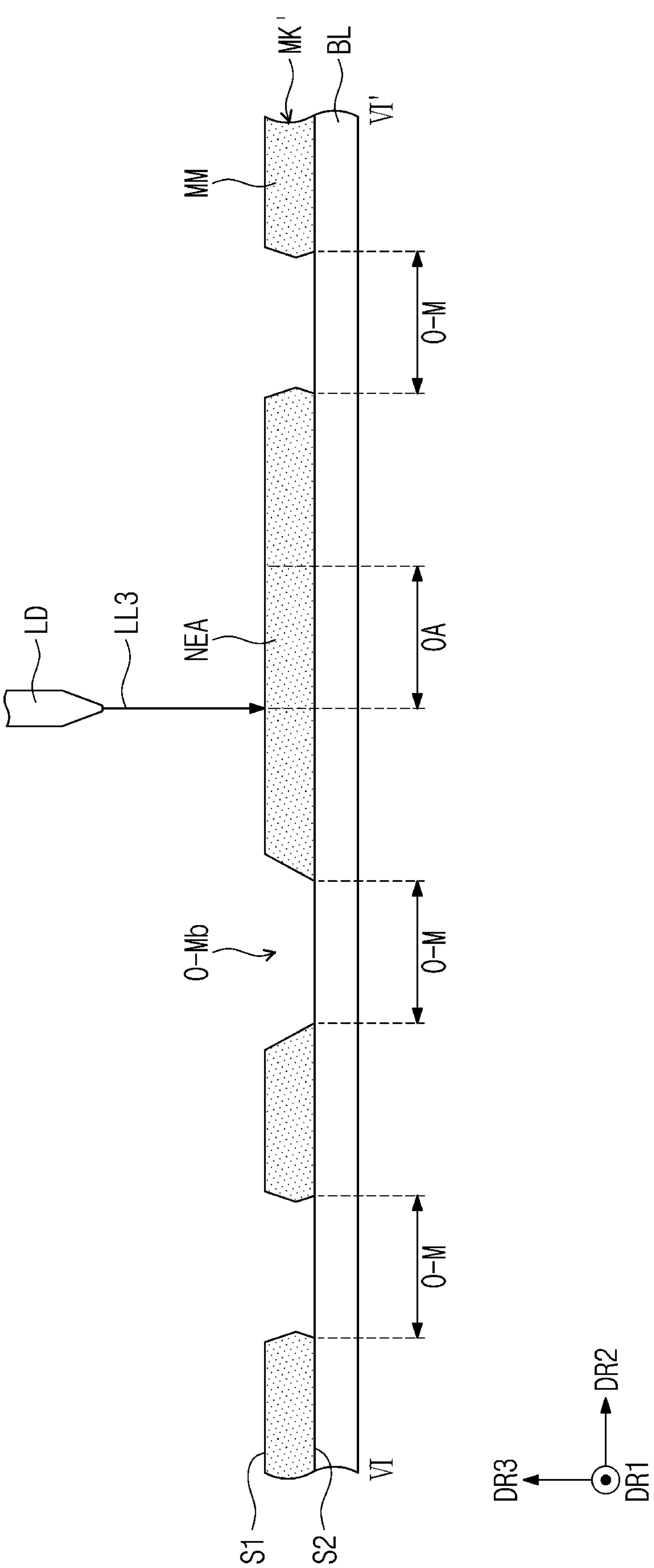
Figure 13C:
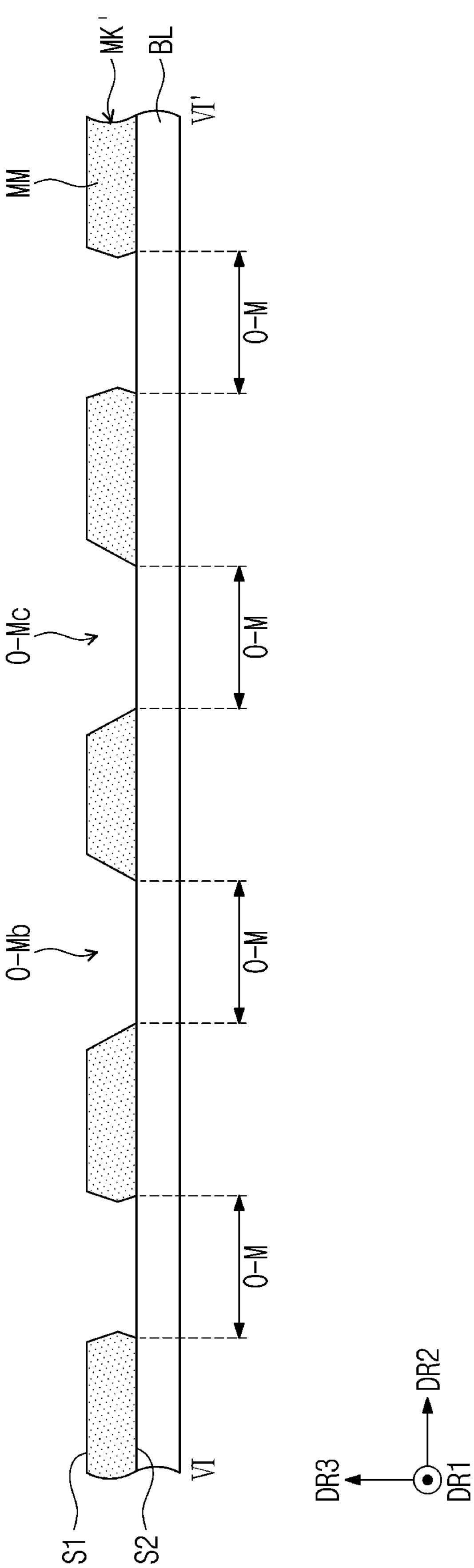

FIGS. 13A to 13C are schematic cross-sectional views of a method of repairing a mask according to an embodiment of the disclosure. FIGS. 13A to 13C are schematic cross-sectional views of masks taken along line VI-VI' of FIG. 10A.

Referring to FIG. 13A, the light irradiation device LD may be provided above the process area OA surrounding the insufficient opening O-M' to repair the insufficient opening O-M'. The light irradiation device LD may irradiate a third laser beam LL3 to the process area OA.

The third laser beam LL3 may have the intensity appropriate to remove the portion of the mother member MM by sublimating or vaporizing. For example, the third laser beam LL3 may be a pulse laser beam with a pulse width (or pulse duration) of picosecond or femtosecond. The third laser beam LL3 and the second laser beam LL2 (refer to FIG. 9C) may be the same laser beam. In a case where both defects, i.e., the over-processed opening OE-O (refer to FIG. 9C) and the insufficient opening O-M', occur in a mask MK', the defects of the over-processed opening OE-O (refer to FIG. 9C) and the insufficient opening O-M' may be repaired in the irradiating of the second laser beam LL2 (refer to FIG. 9C).

Referring to FIGS. 13A and 13B, the insufficient opening O-M' may be processed by using the third laser beam LL3, and thus, the size of the insufficient opening O-M' that is insufficiently formed may increase (or may be corrected). The opening obtained by processing the insufficient opening O-M' and having the increased size may be defined as a second repairing opening O-Mb. The second repairing opening O-Mb and the normal opening O-M may have substantially the same size and shape.

In the case where the non-processed area NEA is defined in the mask MK', the light irradiation device LD may be provided above the non-processed area NEA, and the third laser beam LL3 may be irradiated to the non-processed area NEA. In the case where both defects, i.e., the over-processed opening OE-O (refer to FIG. 9C) and the non-processed area NEA, occur in a mask MK', the defects of the over-processed opening OE-O (refer to FIG. 9C) and the non-processed area NEA may be repaired in the irradiating of the second laser beam LL2 (refer to FIG. 9C).

Referring to FIGS. 13B and 13C, the opening having substantially the same size and shape as those of the normal opening O-M may be formed in the non-processed area NEA using the third laser beam LL3. The opening obtained by processing the non-processed area NEA may be defined as a third repairing opening O-Mc.

As the second and third repairing openings O-Mb and O-Mc are processed by the laser beams, inner side surfaces of the mother member MM, which define the second and third repairing openings O-Mb and O-Mc, may have a substantially flat and inclined surface. The second and third repairing openings O-Mb and O-Mc may be arranged in a direction with the normal openings O-M and may have the same size and shape as those of each of the normal openings O-M.

Figure 14:
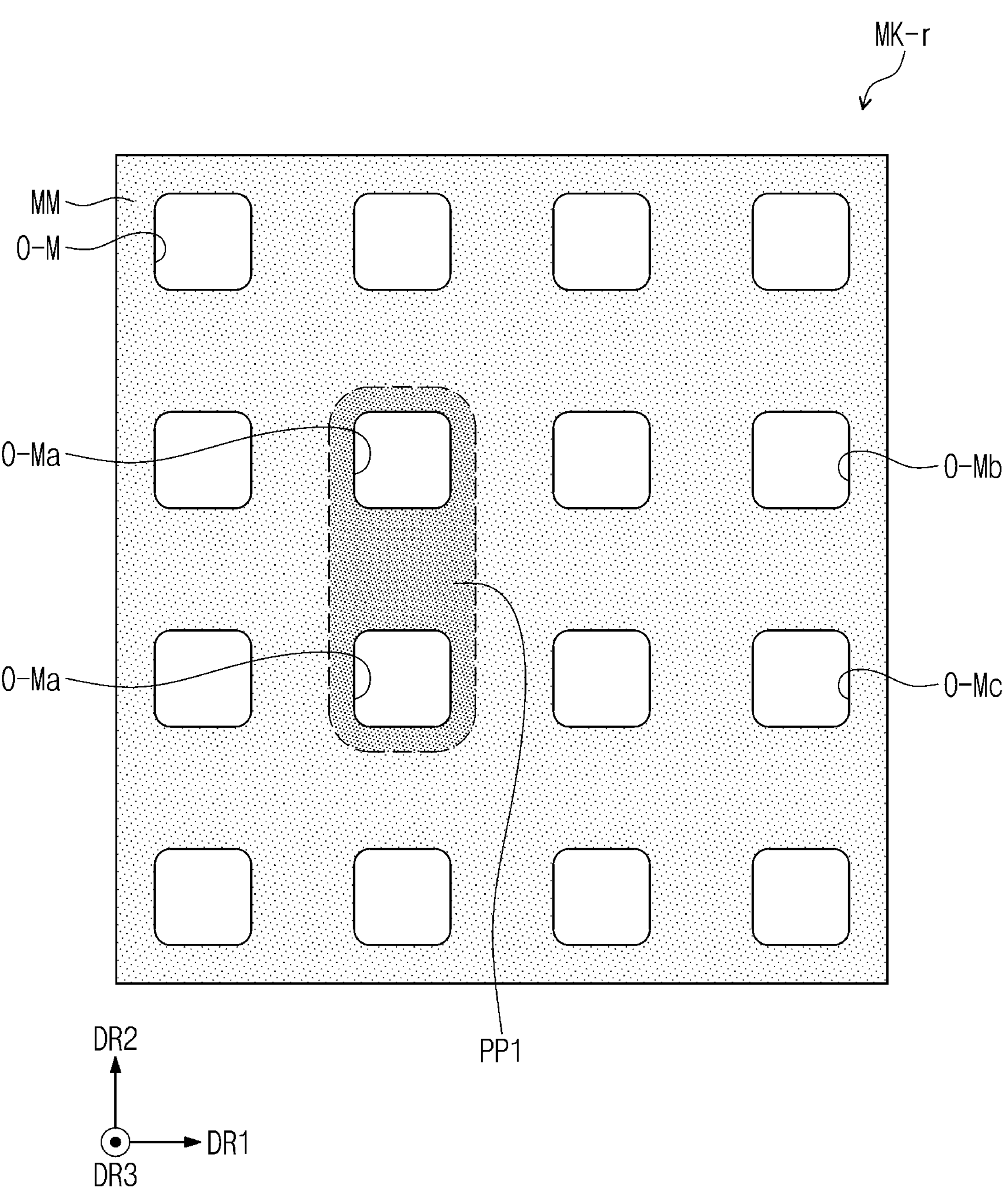
FIG. 14 is a plan view of a mask according to an embodiment of the disclosure.

FIG. 14 is a plan view of a mask MK-r according to an embodiment of the disclosure. FIG. 14 is a plan view of the mask MK-r obtained by repairing the defective mask MK' of FIG. 6B using the repairing method of the mask.

Referring to FIG. 14, the first repairing openings O-Ma, the second repairing opening O-Mb, and the third repairing opening O-Mc may have substantially the same arrangement, shape, and size as those of the openings O-M of the mask MK of FIG. 6A, which has no defect. The repaired mask MK-r may be used in the deposition process, and the deposition pattern may be formed to correspond to the first repairing openings O-Ma, the second repairing opening O-Mb, and the third repairing opening O-Mc. As the mask MK-r is repaired, defects, such as, the deposition pattern is formed in places other than the deposition area, is insufficiently formed, and is not formed, may be prevented, and the production yield of the mask and the reliability of the deposition process may be improved.

Figure 15:
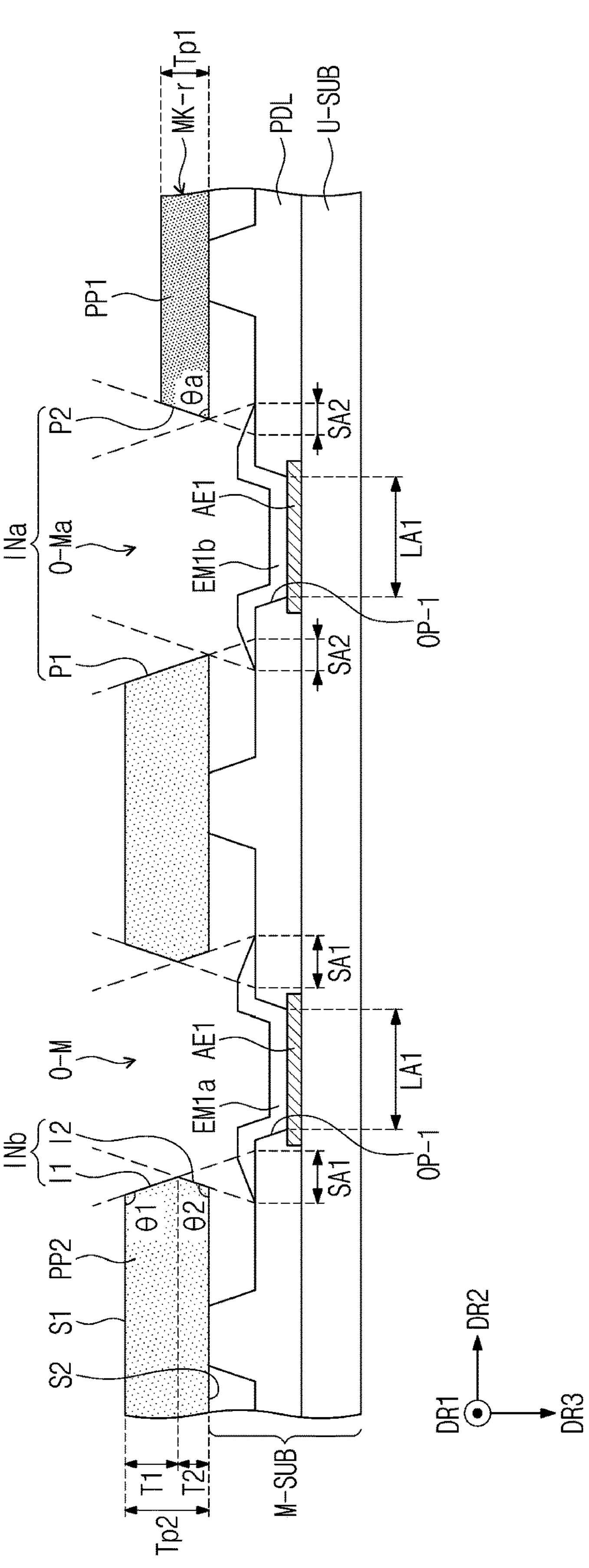
FIG. 15 is a schematic cross-sectional view of a deposition process according to an embodiment of the disclosure.

FIG. 15 is a schematic cross-sectional view of a deposition process according to an embodiment of the disclosure. FIG. 15 shows a deposition process to which the repaired mask MK-r is applied, and details of the components included in the mask MK-r and the process substrate M-SUB are the same as those described above.

The process substrate M-SUB may include a lower substrate U-SUB, the pixel definition layer PDL, and the first electrodes AE1. The lower substrate U-SUB may include the base substrate SUB and the circuit element layer DP-CL of FIG. 5. The pixel definition layer PDL and the first electrodes AE1 may be disposed on the lower substrate U-SUB. The first light emitting openings OP-1 may be defined in the pixel definition layer PDL to expose a portion of the first electrodes AE1. The first light emitting openings OP-1 of the pixel definition layer PDL may define the first light emitting areas LA1 in which the deposition pattern is formed. The hole control layer HCL (refer to FIG. 5) disposed on the pixel definition layer PDL and the first electrodes AE1 is not shown in FIG. 15, however, the hole control layer HCL (refer to FIG. 5) may be disposed on the process substrate M-SUB.

Referring to FIG. 15, the repaired mask MK-r may include the mother member MM, and the mother member MM may be provided with the normal opening O-M and the first repairing opening O-Ma defined therethrough. The normal opening O-M may correspond to the opening that is formed on the mask as designed and is not required to be processed. The first repairing opening O-Ma may be formed by repairing the area in which the over-processed opening OE-O (refer to FIG. 6B) is formed. The normal opening O-M and the first repairing opening O-Ma may have substantially the same shape and size within the process tolerance. Details of the normal opening O-M and the first repairing opening O-Ma are the same as those described above.

The first surface S1 of the mother member MM (refer to FIG. 4) may face the frame FR (refer to FIG. 4), and the second surface S2 may be opposite to the first surface S1 and may face the process substrate M-SUB. The first surface S1 may have the step difference in a cross-sectional view, and the second surface S2 may be flat. Since the second surface S2 facing the process substrate M-SUB is flat, the mask MK-r may be provided on the process substrate M-SUB without being inclined.

For example, the repaired mask MK-r may include the first portion PP1 surrounding at least a portion of the first repairing opening O-Ma and the second portion PP2 surrounding at least a portion of the normal opening O-M, and the thickness Tp1 of the first portion PP1 may be smaller than the thickness Tp2 of the second portion PP2. A portion of the first surface S1, which corresponds to the first portion PP1, may be located below a portion of the first surface S1, which corresponds to the second portion PP2, in the third direction DR3. A portion of the second surface S2, which corresponds to the first portion PP1, and a portion of the second surface S2, which corresponds to the second portion PP2, may be disposed at the same position in the third direction DR3.

The first inner side surface INa may include the first portion surface P1 and the second portion surface P2 facing the first portion surface P1 in the second direction DR2. The second portion surface P2 may correspond to a side surface of the first portion PP1. A length in the third direction DR3 of the second portion surface P2 may correspond to the thickness Tp1 of the first portion PP1.

The second portion surface P2 may be inclined with respect to the second surface S2. The second portion surface P2 and the second surface S2 may form an included angle θa, and the included angle θa may be equal to or less than about 90 degrees. Similarly, the first portion surface P1 and the second surface S2 may form an included angle equal to or less than about 90 degrees. Accordingly, a width of the first repairing opening O-Ma may increase going from the second surface S2 to the first surface S1.

The second inner side surface INb may include the first inclination surface I1 and the second inclination surface I2, which connect the first surface S1 and the second surface S2. The first inclination surface I1 and the second inclination surface I2 may be inclined in different directions from each other. A sum of a length T1 in the third direction DR3 of the first inclination surface I1 and a length T2 in the third direction DR3 of the second inclination surface I2 may correspond to the thickness Tp2 of the second portion PP2. The length T1 in the third direction DR3 of the first inclination surface I1 may be greater than the length T2 in the third direction DR3 of the second inclination surface I2.

The first inclination surface I1 may be inclined with a first included angle θ1 with the first surface S1, and the first included angle θ1 may be equal to or greater than about 90 degrees. The second inclination surface I2 may be inclined with a second included angle θ2 with the second surface S2, and the second included angle θ2 may be equal to or greater than about 90 degrees. Accordingly, the width of the normal opening O-M may decrease at first and later increase going from the second surface S2 to the first surface S1.

Each of the first portion surface P1 and the second portion surface P2 of the first inner side surface INa may be a flat and inclined surface. For example, each of the first portion surface P1 and the second portion surface P2 may be inclined at a constant inclination angle. The second inner side surface INb may include inclination surfaces inclined in different directions from each other. For example, the second inner side surface INb may include the inclination surfaces inclined in different inclination angles from each other with respect to a reference surface. Since the first inner side surface INa defining the first repairing opening O-Ma and the second inner side surface INb defining the normal opening O-M have different shapes from each other, the deposition pattern formed through the first repairing opening O-Ma may have the shape and size different from those of the deposition pattern formed through the normal opening O-M.

Shadow areas formed on the deposition surface of the process substrate M-SUB may have different sizes by an interference of the mask MK-r due to the difference in shape between the first inner side surface INa and the second inner side surface INb. The shadow areas may be areas where the deposition pattern is insufficiently formed because the deposition material is not sufficiently reached due to the interference of the mask MK-r.

A first shadow area SA1 formed corresponding to the normal opening O-M may be greater than a second shadow area SA2 formed corresponding to the first repairing opening O-Ma in a plan view. For example, different from the second inner side surface INb that includes the inclination surfaces inclined in different directions from each other, the first inner side surface INa may include the flat and inclined surface. Therefore, a size of the second shadow area SA2 may be smaller than a size of the first shadow area SA1. Accordingly, an area where the pattern is insufficiently formed may be smaller in a second light emitting pattern EM1*b* formed through the first repairing opening O-Ma than in a first light emitting pattern EM1*a* formed through the normal opening O-M.

As portions of the inner side surfaces of the mask MK-r repaired by the repairing method of the mask of the disclosure have different shapes, the deposition pattern formed by using the repaired mask MK-r may have different shapes or sizes. For example, some of the light emitting patterns formed through the repaired mask MK-r and including the same materials may have different shapes or sizes. However, the difference in shape or size described above may be within the process tolerance and may not affect the reliability of the display panel.

According to the repairing method of the mask of the disclosure, the mask with defects, such as, the opening is over processed, is insufficiently processed, and is not processed, may be repaired by processing the mother member of the mask. Thus, the repairing cost of the mask may be reduced, and the production yield of the mask may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A method of repairing a mask, comprising:

providing a mask comprising a mother member, a plurality of first openings extending entirely through the mask, and an over-processed opening adjacent to one of the plurality of first openings and having a size different from a size of each of the plurality of first openings, each of the plurality of first openings and the over-processed opening defined on the mother member;

irradiating a first laser beam to an area of the mother member surrounding the over-processed opening to melt a portion of the mother member located at the area to form melted material and dispose the melted material into the over-processed opening to form a supplement portion in at least a portion of the over-processed opening; and forming a plurality of second openings spaced apart from each other on the mother member by irradiating a second laser beam to the supplement portion.

2. The method of claim 1, wherein an intensity of the second laser beam is greater than an intensity of the first laser beam.

3. The method of claim 2, wherein the first laser beam is a pulse laser beam with a pulse width of microsecond or nanosecond.

4. The method of claim 2, wherein the second laser beam is a pulse laser beam with a pulse width of picosecond or femtosecond.

5. The method of claim 1, wherein the supplement portion is formed by melting a portion of the mother member, and a thickness of the supplement portion is less than a thickness of the mother member that is not melted in a thickness direction of the mask.

6. The method of claim 1, wherein the forming of the supplement portion further comprises providing a metal powder in the over-processed opening before the irradiating of the first laser beam.

7. The method of claim 1, wherein the plurality of first openings are formed on the mother member by a wet-etching process.

8. The method of claim 1, wherein the mask after the forming of the plurality of second openings comprises:

a first portion disposed between adjacent ones of the plurality of second openings in a plan view; and a second portion disposed between adjacent ones of the plurality of first openings in the plan view, and a thickness of the second portion is less than a thickness of the first portion in a thickness direction of the mask.

9. The method of claim 1, wherein the plurality of second openings are arranged with adjacent one of the plurality of first openings in a direction in a plan view.

10. The method of claim 1, wherein the mask further comprises an insufficient opening having a size smaller than the size of each of the plurality of first openings, and the method further comprises irradiating a third laser beam to an area adjacent to the insufficient opening of the mask.

11. The method of claim 10, wherein an intensity of the third laser beam and an intensity of the second laser beam are same.

12. The method of claim 1, wherein the mask further comprises a non-processed area adjacent to at least one of the plurality of first openings, and the method further comprises irradiating a third laser beam to the non-processed area.

* * * * *